(12) United States Patent
Ishikawa et al.

(10) Patent No.: US 6,840,642 B2
(45) Date of Patent: Jan. 11, 2005

(54) THERMALLY ACTUATED MICRO MIRROR AND ELECTRONIC DEVICE

(75) Inventors: Hiroichi Ishikawa, Kanagawa (JP); Kanji Yokomizo, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/464,663

(22) Filed: Jun. 19, 2003

(65) Prior Publication Data

US 2004/0075881 A1 Apr. 22, 2004

(30) Foreign Application Priority Data

Jun. 28, 2002 (JP) .................................... P2002-190606
Jul. 2, 2002 (JP) .................................... P2002-193314

(51) Int. Cl.[7] .............................................. G02B 7/182
(52) U.S. Cl. ........................ 359/872; 359/873; 359/224
(58) Field of Search ................................ 359/872–877, 359/221–225

(56) References Cited

FOREIGN PATENT DOCUMENTS

| JP | 06-180428 | 6/1994 |
| JP | 08-262364 | 10/1996 |
| JP | 2001-249300 | 9/2001 |
| JP | 2001-264672 | 9/2001 |

*Primary Examiner*—Mohammad Sikder
(74) *Attorney, Agent, or Firm*—Rader, Fishman & Grauer PLLC; Ronald P. Kananen

(57) ABSTRACT

A thermally actuated micro mirror includes a mirror surface, and a support structure section having a multilayer structure to support the mirror surface. The support structure section generates heat by the application of electricity thereto, and is deflected by a difference in coefficient of thermal expansion in the multilayer structure, thereby tilting the mirror surface at an arbitrary angle. The support structure section is disposed between the mirror surface and an electrode section for applying electricity. A longitudinal axis of the support structure section is perpendicular to the center axis of the mirror surface, and the longitudinal center of the support structure section is substantially placed on the center axis of the mirror surface. Therefore, the turning axis of the mirror surface is not displaced, and the light reflecting position does not move on the mirror surface.

20 Claims, 18 Drawing Sheets

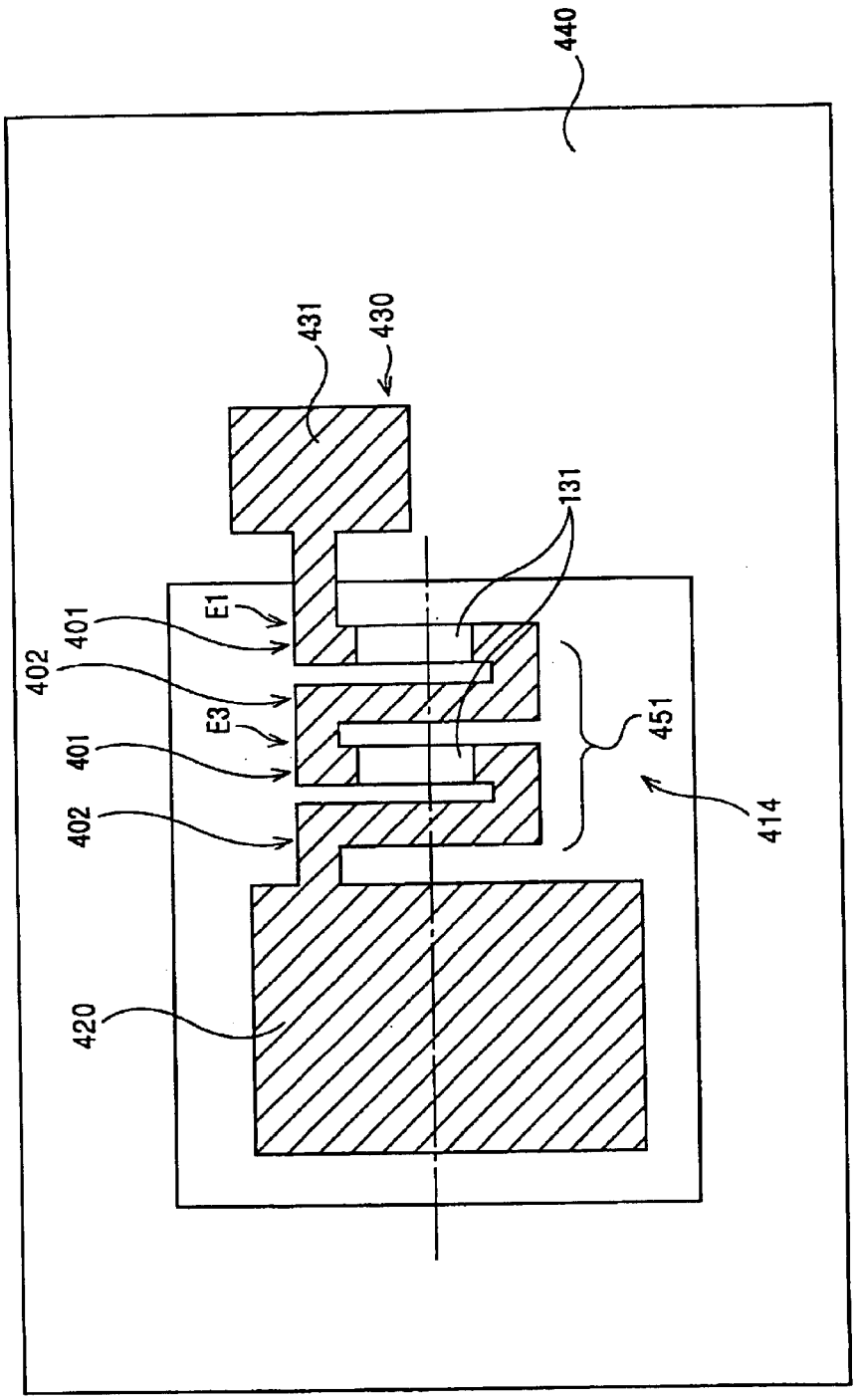

THERMALLY ACTUATED MICRO MIRROR AND ELECTRONIC DEVICE

BACKGROUND OF THE INVENTION

1. Field of the Invention

The present invention relates to a thermally actuated micro mirror in which a mirror surface can be tilted by causing a support structure section to generate heat by the application of electricity, and to an electronic device having the thermally actuated micro mirror.

2. Description of the Related Art

Thermally actuated micro mirrors are used in optical systems of, for example, optical scanners and printers. In the thermally actuated micro mirrors, a mirror surface is tilted by causing a support structure section to generate heat by the application of electricity, and, for example, laser light is thereby deflected and scanned on a target.

FIGS. 15A and 15B show a known type of thermally actuated micro mirror.

A thermally actuated micro mirror 1000 shown in FIGS. 15A and 15B includes a rectangular mirror surface 1001 and a fixed section 1003. Electrodes 1004 are formed on the fixed section 1003, and the mirror surface 1001 is supported relative to the fixed section 1003 by a thermally actuated support structure section 1005 in a so-called cantilevered manner.

The support structure section 1005 is deflected like a bimetal by applying electricity thereto through the electrodes 1004, as shown in FIG. 16, thereby turning the mirror surface 1001 on a turning axis 1006 to tilt at an arbitrary angle θ. In a state in which the mirror surface 1001 is turned by the angle θ, the turning axis 1006 is placed inside the support arm 1005 and outside the mirror surface 1001. In actuality, the turning axis 1006 is not fixed, but moves along the support arm 1005 as the angle θ of the mirror surface 1001 increases because the support structure section 1005 does not deflect in the shape of an ideal arc.

In such a known thermally actuated micro mirror 1000, when laser light L applied onto the mirror surface 1001 is deflected, as shown in FIG. 17A, the following problem arises. As the angle θ of the mirror surface 1001 changes, not only the incident angle of the laser light L, but also a reflecting position 1007 for the laser light L moves on the mirror surface 1001.

In this case, the reflecting position 1007 for the laser light L considerably moves, and this sometimes hinders the design of the optical system. The reflecting position 1007 thus moves with the change of the angle θ of the mirror surface 1001 because the turning axis 1006 of the mirror surface 1001 moves with the change of the angle θ, as described above.

FIG. 17B shows a case in which a turning axis 1010 of a mirror surface 1012 coincides with a reflecting position 1014 for laser light L. In this case, the reflecting position 1014 does not move on the mirror surface 1012.

FIG. 18 shows another known thermally actuated micro mirror 1020. A mirror surface 1024 of the thermally actuated micro mirror 1020 is supported perpendicularly to a fixed section 1026 by a support structure section 1030 and a support structure section 1040. The support structure section 1030 and the support structure section 1040 are deflected by applying electricity thereto. The support structure section 1030 is deflected to turn the mirror surface 1024 in a first axial direction, and the support structure section 1040 is deflected to turn the mirror surface 1024 in a second axial direction. While the thermally actuated micro mirror 1020 is a so-called two-dimensional mirror, the reflecting position for the laser light on the mirror surface greatly moves, the design of the optical system is difficult, and the area of the mirror surface 1024 must be large.

In the known thermally actuated micro mirror 1000 shown in FIGS. 15A and 15B, the area of the mirror surface 1001 must also be large. This is because the turning axis 1006 moves and the reflecting position 1007 for the laser light L moves on the mirror surface 1001 as the angle θ of the mirror surface 1001 increases, as described above. Such an increase in size of the mirror surface 1001 is significantly disadvantageous in terms of size to a mirror for use in, for example, an MEMS (Micro-Electro-Mechanical System).

The known thermally actuated micro mirrors also have the following problems:

Since the mirror surface is tilted by applying electricity to the support structure section, when the temperature of the support structure section itself changes with a change in ambient temperature, the support structure section is thereby deflected.

Portable telephones are sometimes used in various working environments, for example, at a temperature of less than −10° C. outdoors in cold districts, and at approximately 50° C. in the car parked in the summer. That is, the thermally actuated micro mirror like a bimetal is unnecessarily tilted by such a temperature difference of 60° C. This reveals that the initial angle of the mirror surface of the micro mirror depends on the temperature, such as ambient temperature, and that the micro mirror is significantly difficult to use.

The following mirrors have been proposed hitherto.

Japanese Unexamined Patent Application Publication No. 2001-249300 discloses a mirror that turns on its turning axis, and that has recesses for reinforcement. Japanese Unexamined Patent Application Publication No. 2001-264672 discloses a structure in which a mirror turns on a beam serving as a turning axis, and ribs for reinforcing the mirror extend perpendicularly to the beam as the turning axis.

Japanese Unexamined Patent Application Publication No. Hei 6-180428 teaches that a two-axis gimbal mirror that is driven by electrostatic force. The mirror turns on twistable beams serving as turning centers. Japanese Unexamined Patent Application Publication No. 8-262364 discloses a mirror that is mounted in a cantilevered manner at the leading ends of beams made of a shape-memory alloy, and that is tilted by deflecting the beams. When driving is performed by electrostatic force, the voltage must be high, and in general, it is difficult to achieve a large tilting angle. For that purpose, driving is frequency performed by resonance.

When resonance is used, it is difficult to control the angle and to perform tilting in a biased manner in which the time-phase relationship is not sinusoidal. Since the above mirror using a shape-memory alloy is mounted in a cantilevered manner, the center axis is displaced.

SUMMARY OF THE INVENTION

The present invention has been made to solve the above problems, and it is a first object of the present invention to provide a thermally actuated micro mirror in which the size of a mirror surface can be reduced by preventing the turning center of the mirror surface from being displaced so that a light reflecting position does not move on the mirror surface, and to provide an electronic device having the thermally actuated micro mirror.

It is another object of the present invention to provide a thermally actuated micro mirror in which the size of a mirror surface can be reduced by placing the turning center of the mirror surface at almost the center of the mirror surface without being displaced so that a light reflecting position does not move on the mirror surface, and the angle of the mirror surface hardly changes with a change in ambient temperature, and to provide an electronic device having the thermally actuated micro mirror.

In order to achieve the above objects, according to an aspect, the present invention provides a thermally actuated micro mirror including a mirror surface, and a support structure section having a multilayer structure to support the mirror surface, wherein the mirror surface is tilted by the deflection of the support structure section caused by a difference in coefficient of thermal expansion in the multilayer structure due to heat generated in the support structure section by the application of electricity, the support structure section is disposed between the mirror surface and an electrode section for applying the electricity, a longitudinal axis of the support structure section is perpendicular to a center axis of the mirror surface, and a longitudinal center of the support structure section is substantially placed on the center axis of the mirror surface.

The support structure section is disposed between the mirror surface and the electrode section for applying electricity. The longitudinal axis of the support structure section is perpendicular to the center axis of the mirror surface. The longitudinal center of the support structure section is placed on the center axis of the mirror surface.

Accordingly, when the support structure section is deflected like a bimetal by heat generated by the application of electricity thereto, a light reflecting position does not move on the mirror surface even when the angle of the mirror surface changes because the longitudinal axis of the support structure section is perpendicular to the center axis of the mirror surface and the longitudinal center of the support structure section is substantially placed on the center axis of the mirror surface. This can minimize the size of the mirror surface, and can reduce the size of the thermally actuated micro mirror.

Preferably, the support structure section includes a first support arm and a second support arm, the electrode section includes a first electrode and a second electrode, the first support arm is disposed between a first end of the mirror surface and the first electrode, the second support arm is disposed between a second end of the mirror surface and the second electrode, and the first end and the second end are symmetric about that the mirror surface.

The first support arm of the support structure section is disposed between the first end of the mirror surface and the first electrode of the electrode section. Similarly, the second support arm of the support structure section is disposed between the second end of the mirror surface and the second electrode of the electrode section. The first end and the second end are symmetric about the mirror surface. Therefore, the mirror surface is supported by the support arms on both sides thereof.

Preferably, the support structure section has one support arm, the electrode section has one electrode, and the support arm is disposed between one end of the mirror surface and the electrode.

The support structure section has one support arm that is disposed between one end of the mirror surface and the electrode. In this case, the mirror surface is supported by one support arm in a so-called cantilevered manner.

Preferably, the first support arm includes a first heater layer, and conductive layers disposed on a first surface and a second surface of the first heater layer to conduct the electricity in order to prevent heat generation in the first heater layer, and the first heater layer generates heat in a portion of the first surface where the conductive layer is not formed so that the first support arm deflects. The second support arm includes a second heater layer, and conductive layers disposed on a third surface and a fourth surface of the second heater layer to conduct the electricity in order to prevent heat generation in the second heater layer, the second heater layer generates heat in a portion of the third surface where the conductive layer is not formed so that the second support arm deflects in the same direction as that of the first support arm.

The first support arm includes the first heater layer and the conductive layers. The conductive layers are disposed on the first surface and the second surface of the first heater layer, and conduct the electricity to prevent the application of the electricity to the first heater layer so that the first heater layer does not generate heat. The first heater layer generates heat in a portion of the first surface thereof where the conductive layer is not formed, and as a result, the first support arm deflects.

Similarly, the second support arm includes the second heater layer and the conductive layers. The conductive layers are disposed on a third surface and a fourth surface of the second heater layer, and conduct the electricity to prevent the application of electricity to the second heater layer so that the second heater layer does not generate heat. Since electricity is applied to a portion of the third surface of the second heater layer where the conductive layer is not formed, the portion generates heat, and as a result, the second support arm deflects in the same direction as that of the first support arm.

Preferably, the support arm includes a heater layer, and conductive layers disposed on one surface and the other surface of the heater layer to conduct the electricity in order to prevent heat generation in the heater layer, and the heater layer generates heat in a portion of the one surface where the conductive layer is not formed so that the support arm deflects.

The support arm includes the heater layer and the conductive layers. The conductive layers are disposed on one surface and the other surface of the heater layer, and conduct electricity to prevent the application of electricity to the heater layer so that the heater layer does not generate heat. Since electricity is applied to a portion of the one surface of the heater layer where the conductive layer is not formed, the portion generates heat, and as a result, the support arm deflects.

Preferably, the support structure section includes a first arm portion that is deflected by the application of the electricity, and a second arm portion disposed parallel to the first arm portion not to be deflected by the application of the electricity thereto, but to be deflected by a change in ambient temperature and by residual internal stress in the same direction as that of the first arm portion in order to compensate for deflection of the first arm portion due to the change in ambient temperature and by the residual internal stress, a longitudinal axis of the first arm portion and a longitudinal axis of the second arm portion are perpendicular to the center axis of the mirror surface, and a longitudinal center of the first arm portion and a longitudinal center of the second arm portion are substantially placed on the center axis of the mirror surface.

The support structure section includes the first arm portion that is deflected by the application of electricity, and the second arm portion that is not deflected by the application of electricity. The second arm portion is parallel to the first arm portion. The longitudinal axis of the first arm portion and the longitudinal axis of the second arm portion are perpendicular to the center axis of the mirror surface. The longitudinal center of the first arm portion and the longitudinal center of the second arm portion are substantially placed on the center axis of the mirror surface.

When the support structure section is deflected like a bimetal by heat generated by applying electricity thereto, a light reflecting position on the mirror surface does not move even when the angle of the mirror surface changes because the longitudinal axis of the first arm portion and the longitudinal axis of the second arm portion are perpendicular to the center axis of the mirror surface, and the longitudinal center of the first arm portion and the longitudinal center of the second arm portion are substantially placed on the center axis of the mirror surface. This can minimize the size of the mirror surface, and can reduce the size of the thermally actuated micro mirror.

The support structure section includes the first arm portion that is deflected by the application of electricity and the second arm portion that is not deflected by the application of electricity. Therefore, when the ambient temperature increases, the first arm portion and the second arm portion are similarly heated, and deflect in the same direction. Since the first arm portion and the second arm portion are deflected in the same direction by a change in ambient temperature, deflection of the first arm portion due to the change in ambient temperature can be compensated for. Consequently, the initial angle of the mirror surface is prevented from being changed by the change in ambient temperature.

Preferably, one end of the first arm portion is connected to the electrode section, the other end of the first arm portion is connected to one end of the second arm portion, the other end of the second arm portion is connected to a first end of the mirror surface, and the one end of the first arm portion and the other end of the second arm portion are placed on a line parallel to the center axis of the mirror surface.

Since the one end of the first arm portion and the other end of the second arm portion are placed on a line parallel to the center axis of the mirror surface, when the first and second arm portions are deflected in the same direction by a change in ambient temperature, the initial angle of the mirror surface can be maintained, regardless of the change in ambient temperature.

That is, even when the arm is deflected by a change in ambient temperature and residual internal stress, the relative positions of the fixed end of the arm and the end of the arm connected to the mirror surface are not changed.

Preferably, the support structure section is symmetrically disposed at each of the first end of the mirror surface and a second end of the mirror surface remote from the first end.

Preferably, the first arm portion includes a first heater layer, a first conductive layer disposed on a first surface of the heater layer to conduct the electricity in order to prevent heat generation in the first heater layer, and a high temperature expansion layer disposed on a second surface of the first heater layer, and the first heater layer generates heat in a portion of the first surface where the first conductive layer is not formed so that the first arm portion deflects. The second arm portion includes a second heater layer, a second conductive layer disposed on a third surface of the second heater layer and on the same side of the first conductive layer in the first arm portion, and a high temperature expansion layer disposed on a fourth surface of the second heater layer, and the second conductive layer conducts the electricity to prevent heat generation in the second heater layer.

The first arm portion includes the first heater layer, the first conductive layer, and the high temperature expansion layer. The first conductive layer is disposed on the first surface of the first heater layer, and the high temperature expansion layer is placed on the second surface. The first conductive layer conducts electricity to prevent the application of electricity to the first heater layer and to thereby prevent heat generation in the first heater layer. The first heater layer generates heat in a portion of the first surface where the conductive layer is not formed, so that the first arm portion is deflected by a bimetal effect in cooperation with the high temperature expansion layer.

Similarly, the second arm portion includes the second heater layer, the second conductive layer, and the high temperature expansion layer. Even when electricity is applied to the second arm portion, it flows through the second conductive layer, but does not flow through the second heater layer, that is, the second heater layer does not generate heat. For this reason, the second arm portion is not deflected by the application of electricity.

Preferably, the thermally actuated micro mirror further includes at least one pair of the first and second arm portions, the first arm portions are disposed in the odd-numbered positions from the electrode section, and the second arm portions are disposed in the even-numbered positions from the electrode section.

According to another aspect, the present invention provides an electronic device having a thermally actuated micro mirror that includes a mirror surface, and a support structure section having a multilayer structure to support the mirror surface, wherein the mirror surface is tilted by the deflection of the support structure section caused by a difference in coefficient of thermal expansion in the multilayer structure due to heat generated in the support structure section by the application of electricity, the support structure section is disposed between the mirror surface and an electrode section for applying the electricity, a longitudinal axis of the support structure section is perpendicular to a center axis of the mirror surface, and a longitudinal center of the support structure section is substantially placed on the center axis of the mirror surface.

The support structure section is disposed between the mirror surface and the electrode section for applying electricity. The longitudinal axis of the support structure section is perpendicular to the center axis of the mirror surface. The longitudinal center of the support structure section is placed on the center axis of the mirror surface.

Accordingly, when the support structure section is deflected like a bimetal by heat generated by the application of electricity thereto, a light reflecting position does not move on the mirror surface even when the angle of the mirror surface changes because the longitudinal axis of the support structure section is perpendicular to the center axis of the mirror surface and the longitudinal center of the support structure section is substantially placed on the center axis of the mirror surface. This can minimize the size of the mirror surface, and can reduce the size of the thermally actuated micro mirror.

Preferably, the support structure section includes a first support arm and a second support arm, the electrode section includes a first electrode and a second electrode, the first support arm is disposed between a first end of the mirror surface and the first electrode, the second support arm is disposed between a second end of the mirror surface and the second electrode, and the first end and the second end are symmetric about that the mirror surface.

The first support arm of the support structure section is disposed between the first end of the mirror surface and the first electrode of the electrode section. Similarly, the second support arm of the support structure section is disposed between the second end of the mirror surface and the second electrode of the electrode section. The first end and the second end are symmetric about the mirror surface. Therefore, the mirror surface is supported by the support arms on both sides thereof.

Preferably, the support structure section has one support arm, the electrode section has one electrode, and the support arm is disposed between one end of the mirror surface and the electrode.

The support structure section has one support arm that is disposed between the end of the mirror surface and the electrode. In this case, the mirror surface is supported by one support arm in a so-called cantilevered manner.

Preferably, the first support arm includes a first heater layer, and conductive layers disposed on a first surface and a second surface of the first heater layer to conduct the electricity in order to prevent heat generation in the first heater layer, and the first heater layer generates heat in a portion of the first surface where the conductive layer is not formed so that the first support arm deflects. The second support arm includes a second heater layer, and conductive layers disposed on a third surface and a fourth surface of the second heater layer to conduct the electricity in order to prevent heat generation in the second heater layer, and the second heater layer generates heat in a portion of the third surface where the conductive layer is not formed so that the second support arm deflects in the same direction as that of the first support arm.

The first support arm includes the first heater layer and the conductive layers. The conductive layers are placed on the first surface and the second surface of the first heater layer, and conduct the electricity to prevent the application of the electricity to the first heater layer so that the first heater layer does not generate heat. The first heater layer generates heat in a portion of the first surface thereof where the conductive layer is not formed, and as a result, the first support arm deflects.

Similarly, the second support arm includes the second heater layer and the conductive layers. The conductive layers are placed on the third surface and the fourth surface of the second heater layer, and conduct the electricity to prevent the application of electricity to the second heater layer so that the second heater layer does not generate heat. Since electricity is applied to a portion of the third surface of the second heater layer where the conductive layer is not formed, the portion generates heat, and as a result, the second support arm deflects in the same direction as that of the first support arm.

Preferably, the support arm includes a heater layer, and conductive layers disposed on one surface and the other surface of the heater layer to conduct the electricity in order to prevent heat generation in the heater layer, and the heater layer generates heat in a portion of the one surface where the conductive layer is not formed so that the support arm deflects.

The support arm includes the heater layer and the conductive layers. The conductive layers are placed on one surface and the other surface of the heater layer, and conduct electricity to prevent the application of electricity to the heater layer so that the heater layer does not generate heat. Since electricity is applied to a portion of the one surface of the heater layer where the conductive layer is not formed, the portion generates heat, and as a result, the support arm deflects.

Preferably, the support structure section includes a first arm portion that is deflected by the application of the electricity, and a second arm portion disposed parallel to the first arm portion not to be deflected by the application of the electricity thereto, but to be deflected by a change in ambient temperature and by residual internal stress in the same direction as that of the first arm portion in order to compensate for deflection of the first arm portion due to the change in ambient temperature and by the residual internal stress, a longitudinal axis of the first arm portion and a longitudinal axis of the second arm portion are perpendicular to the center axis of the mirror surface, and a longitudinal center of the first arm portion and a longitudinal center of the second arm portion are substantially placed on the center axis of the mirror surface.

The support structure section includes the first arm portion that is deflected by the application of electricity, and the second arm portion that is not deflected by the application of electricity. The second arm portion is parallel to the first arm portion. The longitudinal axis of the first arm portion and the longitudinal axis of the second arm portion are perpendicular to the center axis of the mirror surface. The longitudinal center of the first arm portion and the longitudinal center of the second arm portion are substantially placed on the center axis of the mirror surface.

Accordingly, when the support structure section is deflected like a bimetal by heat generated by applying electricity thereto, a light reflecting position on the mirror surface does not move even when the angle of the mirror surface changes because the longitudinal axis of the first arm portion and the longitudinal axis of the second arm portion are perpendicular to the center axis of the mirror surface, and the longitudinal center of the first arm portion and the longitudinal center of the second arm portion are substantially placed on the center axis of the mirror surface. This can minimize the size of the mirror surface, and can reduce the size of the thermally actuated micro mirror.

The support structure section includes the first arm portion that is deflected by the application of electricity and the second arm portion that is not deflected by the application of electricity. Therefore, when the ambient temperature increases, the first arm portion and the second arm portion are similarly heated, and deflect in the same direction. Since the first arm portion and the second arm portion are deflected in the same direction by a change in ambient temperature, deflection of the first arm portion due to the change in ambient temperature can be compensated. Consequently, the initial angle of the mirror surface is prevented from being changed by the change in ambient temperature.

Preferably, one end of the first arm portion is connected to the electrode section, the other end of the first arm portion is connected to one end of the second arm portion, the other end of the second arm portion is connected to a first end of the mirror surface, and the one end of the first arm portion and the other end of the second arm portion are placed on a line parallel to the center axis of the mirror surface.

Since the one end of the first arm portion and the other end of the second arm portion are placed on a line parallel to the center axis of the mirror surface, when the first and second arm portions are deflected in the same direction by a change in ambient temperature, the initial angle of the mirror surface can be maintained, regardless of the change in ambient temperature.

Preferably, the support structure section is symmetrically disposed at each of the first end of the mirror surface and a second end of the mirror surface remote from the first end.

Preferably, the first arm portion includes a first heater layer, a first conductive layer disposed on a first surface of the heater layer to conduct the electricity in order to prevent heat generation in the first heater layer, and a high temperature expansion layer disposed on a second surface of the first heater layer, and the first heater layer generates heat in a portion of the first surface where the first conductive layer is not formed so that the first arm portion deflects. The second arm portion includes a second heater layer, a second conductive layer disposed on a third surface of the second heater layer and on the same side of the first conductive layer in the first arm portion, and a high temperature expansion layer disposed on a fourth surface of the second heater layer, and the second conductive layer conducts the electricity to prevent heat generation in the second heater layer.

The first arm portion includes the first heater layer, the first conductive layer, and the high temperature expansion layer. The first conductive layer is disposed on first surface of the first heater layer, and the high temperature expansion layer is disposed on the second surface. The first conductive layer conducts electricity to prevent the application of electricity to the first heater layer and to thereby prevent heat generation in the first heater layer. The first heater layer generates heat in a portion of the first surface where the conductive layer is not formed, so that the first arm portion is deflected by a bimetal effect in cooperation with the high temperature expansion layer.

Similarly, the second arm portion includes the second heater layer, the second conductive layer, and the high temperature expansion layer. Even when electricity is applied to the second support arm, it flows through the second conductive layer, but does not flow through the second heater layer, that is, the second heater layer does not generate heat. For this reason, the second arm portion is not deflected by the application of electricity.

Preferably, the electronic device further includes at least one pair of the first and second arm portions, the first arm portions are disposed in the odd-numbered positions from the electrode section, and the second arm portions are disposed in the even-numbered positions from the electrode section.

Further objects, features and advantages of the present invention will become apparent from the following description of the preferred embodiments with reference to the attached drawings.

BRIEF DESCRIPTION OF THE DRAWINGS

FIG. 8 is an explanatory view showing a state in which the initial angle of the mirror surface is not affected by changes in ambient temperature or the like;

FIG. 14 is a plan view of a thermally actuated micro mirror according to a fourth embodiment of the present invention;

DESCRIPTION OF THE PREFERRED EMBODIMENTS

Preferred embodiments of the present invention will be described in detail below with reference to the attached drawings.

Since the following embodiments are just preferred embodiments of the present invention, they include various technically preferred restrictions. However, the scope of the present invention is not limited to these embodiments, unless otherwise specified in the following descriptions.

Figure 1:
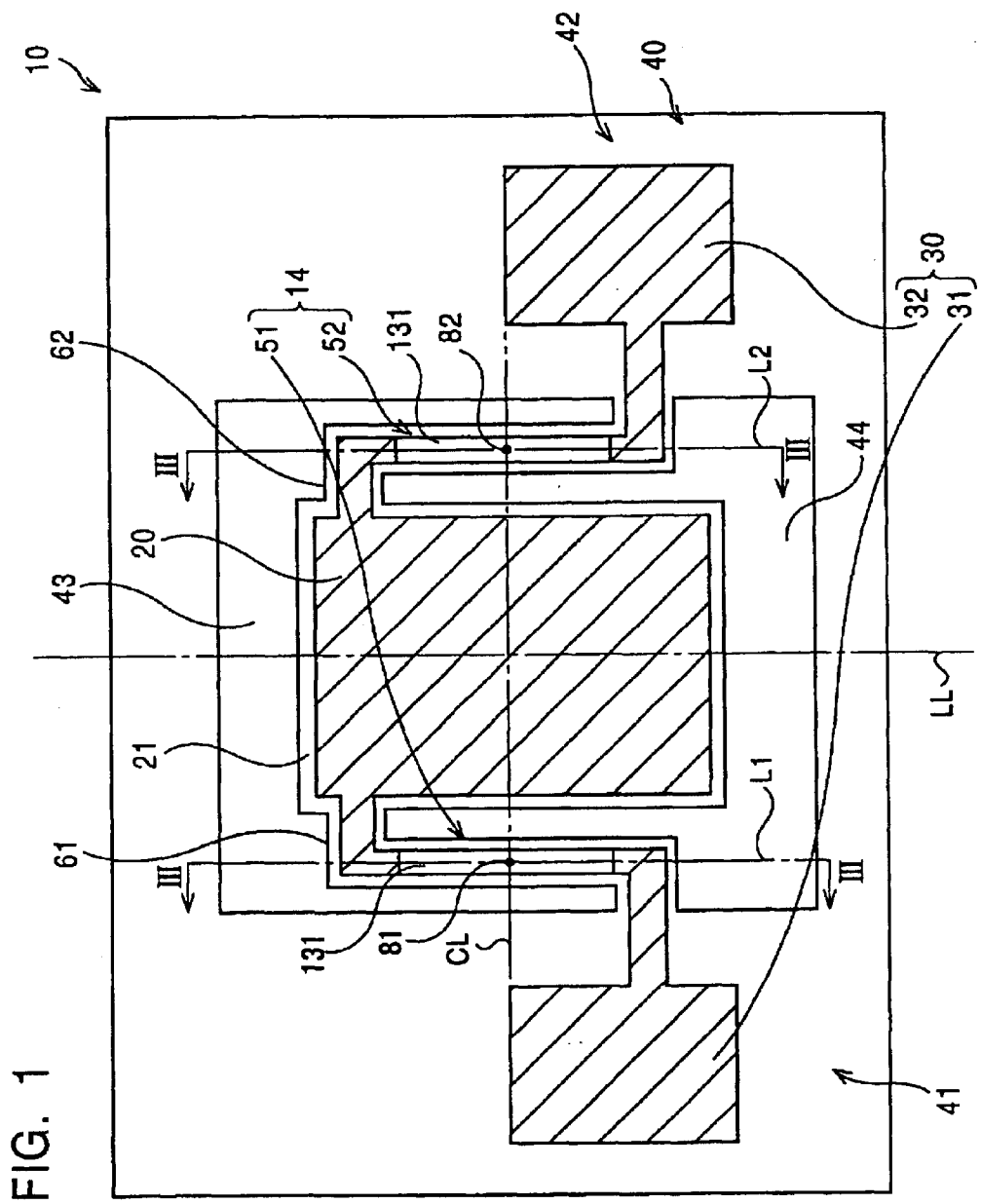
FIG. 1 is a plan view of a thermally actuated micro mirror according to a first embodiment of the present invention.

FIG. 1 shows a thermally actuated micro mirror according to a first embodiment of the present invention. Referring to FIG. 1, a thermally actuated micro mirror 10 includes a support structure section 14, a mirror surface 20, an electrode section 30, and a fixed section 40.

The fixed section 40 is, for example, a platelike member made of a semiconductor substrate such as a silicon substrate.

The mirror surface 20 and the support structure section 14 are formed by, for example, punching the fixed section 40. Openings 43 and 44 are formed between the mirror surface 20 and the support structure section 14.

In the thermally actuated micro mirror 10, the mirror surface 20 is supported by the support structure section 14 in a so-called straddle-mounted manner so that it is symmetric about a longitudinal center axis LL with respect to the fixed section 40.

First, the mirror surface 20 will be described.

The mirror surface 20 shown in FIG. 1 is, for example, rectangular, and is formed on a base member 21. The mirror surface 20 is made of a metal that is conductive and light-reflective, for example, aluminum or gold. The base member 21 is shaped like a rectangle slightly larger than the rectangle of the mirror surface 20. The base member 21 and the fixed section 40 are formed integrally. The base member 21 and the mirror surface 20 are placed between the openings 43 and 44.

Next, the electrode section 30 will be described.

The electrode section 30 includes a first electrode 31 and a second electrode 32. The first and second electrodes 31 and 32 are, for example, rectangular. The first electrode 31 is disposed on a first area 41 of the fixed section 40, and the second electrode 32 is disposed on a second area 42 of the fixed section 40 remote from the first area 41.

The first and second electrodes 31 and 32 are made of a conductive metal such as aluminum or gold, and are symmetrically arranged about the longitudinal center axis LL of the mirror surface 20. Electricity for thermal driving is applied from a power supply (not shown) to the first and second electrodes 31 and 32.

Next, the support structure section 14 will be described.

The support structure section 14 shown in FIG. 1 includes a first support arm 51 and a second support arm 52, and is formed between the mirror surface 20 and the electrode section 30. More specifically, the first support arm 51 is formed between a first end 61 of the base member 21 of the mirror surface 20, and the first electrode 31. The second support arm 52 is formed between a second end 62 of the base member 21 and the second electrode 32. The first electrode 31 and the second electrode 32 are also referred to as "electrode pads".

The first support arm 51 and the second support arm 52 are arranged symmetrically about the longitudinal center axis LL of the mirror surface 20.

The following characteristic features are adopted so that the turning center of the mirror surface 20 substantially or completely coincides with the centers of the first support arm 51 and the second support arm 52.

A longitudinal axis L1 of the first support arm 51 is perpendicular to a center axis (also referred to as a turning center axis) CL of the mirror surface 20, and a longitudinal axis L2 of the second support arm 52 is also perpendicular to the center axis CL. Therefore, the longitudinal axis L1 of the first support arm 51 and the longitudinal axis L2 of the second support arm 52 are parallel to the longitudinal center axis LL of the mirror surface 20.

Moreover, a longitudinal center point 81 of the first support arm 51 and a longitudinal center point 82 of the second support arm 52 are substantially or exactly placed on the center axis CL of the mirror surface 20.

Diagonally shaded portions of the mirror surface 20, the first and second support arms 51 and 52, and the first and second electrodes 31 and 32 are provided with a metal film. The metal film is a conductive film of, for example, aluminum or gold described above.

Accordingly, when electricity is applied from the unshown power supply to the first electrode 31 and the second electrode 32, it flows therebetween through the first support arm 51, the mirror surface 20, and the second support arm 52.

Figure 2:
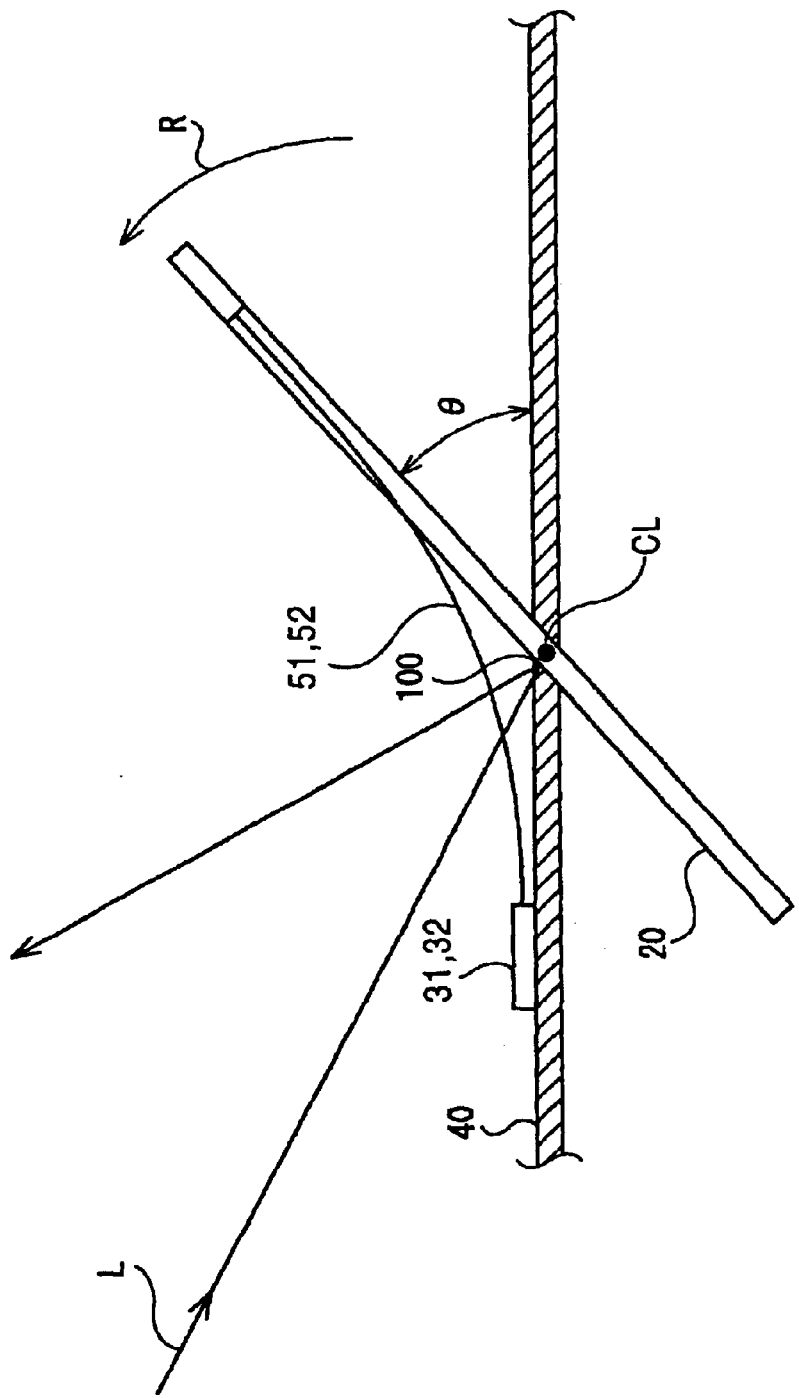
FIG. 2 is an explanatory view showing a state a mirror surface is tilted in the thermally actuated micro mirror shown in FIG. 1.

FIG. 2 shows a state in which the mirror surface 20 is tilted at an arbitrary angle θ when electricity is applied from the power supply to the first electrode 31 and the second electrode 32 in the thermally actuated micro mirror 10 shown in FIG. 1.

In this case, the first support arm 51 and the second support arm 52 are simultaneously deflected in the same direction, that is, in the direction R in FIG. 2 by the application of electricity. The center point 81 of the first support arm 51 and the center point 82 of the second support arm 52 may be substantially or exactly placed on the center axis CL of the mirror surface 20.

The center axis CL is also referred to as the "turning center axis" or as the "turning axis".

FIG. 2 shows that the center axis (turning axis) CL of the mirror surface 20 is hardly displaced even when the angle θ of the mirror surface 20 changes. When the first support arm 51 and the second support arm 52 deflect in the shape of a substantially perfect arc in the same direction R, the turning axis of the mirror surface 20 coincides with the center axis CL.

While the first support arm 51 and the second support arm 52 will, in actuality, not deflect in the shape of a perfect arc because of the distribution of heat and variations of the characteristic of the used materials, they seem to deform in the shape of a substantially perfect arc, as shown in FIG. 2. Therefore, the turning axis of the mirror surface 20 when the mirror surface 20 actually turns substantially or completely coincides with the geometric center axis CL of the mirror surface 20, and does not greatly deviate therefrom. Accordingly, for example, when laser light L as an example of light is applied to the center axis CL, a reflecting position 100 of the laser light L is rarely displaced on the mirror surface 20.

Conversely, since the reflecting position 100 of the laser light L is not displaced, a reflecting plane of the mirror surface 20 does not need to be large on the assumption that the reflecting position 100 may be displaced. This minimizes the area of the mirror surface 20, and reduces the size of the thermally actuated micro mirror 10.

Figure 3A:
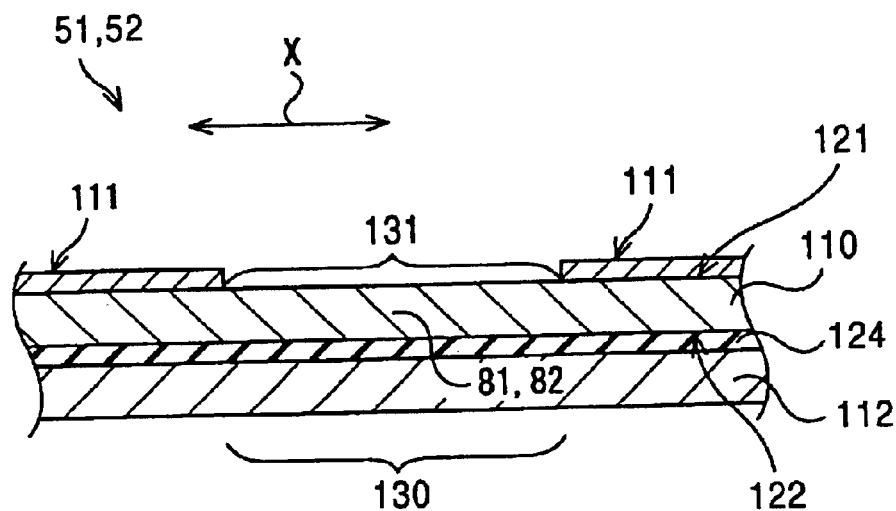
FIGS. 3A and 3B are explanatory views, respectively, showing a state in which electricity is not applied to a first support arm and a second support arm and a state in which electricity is applied thereto.
Figure 3B:
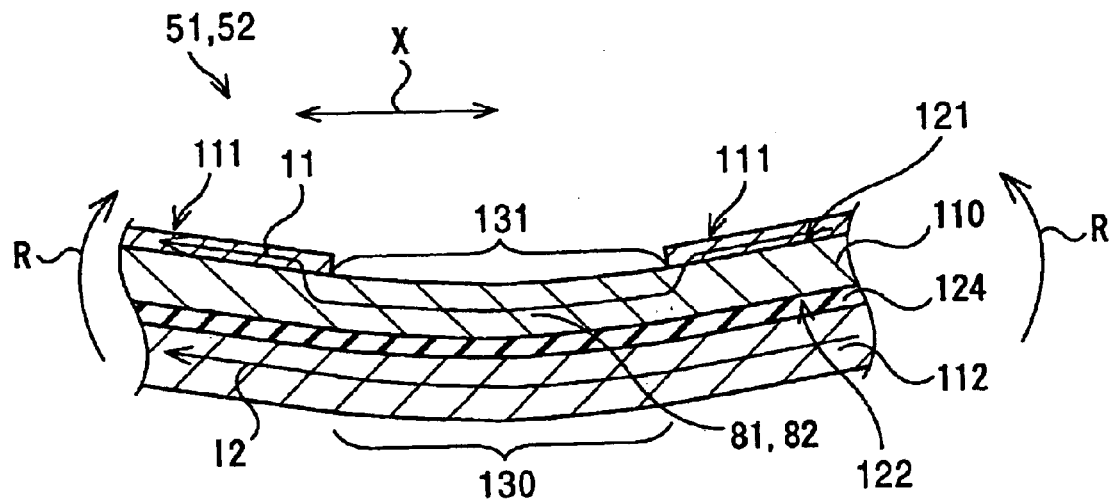

FIGS. 3A and 3B show an example of a multilayer structure of the first support arm 51 and the second support arm 52 shown in FIGS. 1 and 2. FIG. 3A shows a state in which electricity is not applied to the first support arm 51 and the second support arm 52, and FIG. 3B shows a state in which the first support arm 51 and the second support arm 52 are deflected in the same direction R by the application of electricity.

A cross section of the first support arm 51 and the second support arm 52 shown in FIG. 3A is taken along line III—III in FIG. 1.

The first support arm 51 and the second support arm 52 have a similar multilayer structure, and include a heater layer 110, a conductive layer 111, and a high temperature expansion layer (chiefly, a metal film) 112.

The heater layer 110 is an electric resistor made of, for example, doped ρ-Si. The conductive layer 111 is formed on one surface 121 of the heater layer 110. The high temperature expansion layer 112 is formed on the other surface 122 of the heater layer 110 with an insulating layer 124 therebetween.

The conductive layer 111 and the high temperature expansion layer 112 are made of a metal that conducts electricity, for example, aluminum or gold. The conductive layer 111 is thinner than the high temperature expansion layer 112. The conductive layer 111 is not formed in an area 131 of one surface 121 of the heater layer 110 corresponding to a deflecting region 130 where deflection is caused, and the one surface 121 is exposed therefrom. In FIG. 1, such areas 131 are unhatched along the longitudinal axis L1 and the longitudinal axis L2.

Such a multilayer structure of the first support arm 51 and the second support arm 52 is formed to provide the deflecting region 130.

The insulating layer 124 may be made of, for example, $Si_3N_4$, and serves to electrically insulate the heater layer 110 and the high temperature expansion layer 112.

When electricity is applied to the heater layer 110, the deflecting region 130 is deflected in the direction R because of a difference in coefficient of thermal expansion between the high temperature expansion layer 112 of aluminum and the heater layer 110, as shown in FIG. 3B. The coefficient of thermal expansion of aluminum of the high temperature expansion layer 112 is $2.3 \times 10^{-6}$/K, and the coefficient of thermal expansion of doped ρ-Si is $2.3 \times 10^{-5}$/K. The coefficients of thermal expansion of the two materials are different by one digit. The first support arm 51 and the second support arm 52 are heated by applying electricity to the heater layer 110 of doped ρ-Si.

The thickness of the insulating layer 124 is sufficiently less than those of the heater layer 110 and the high temperature expansion layer 112. The reason of this is as follows. Since the coefficients of thermal expansion of the insulating layer 124 and the heater layer 110 are similar, and, great deflection is achieved when the total thickness of the insulating layer 124 and the heater layer 110 is similar to that of the high temperature expansion layer 112. In order to reduce the driving voltage of the heater layer 110, it is preferable that the resistance of the heater layer 110 be low, and that the thickness of the heater layer 110 be as large as possible. When the heater layer 110 is thick, the insulating layer 124 must be thin. As the thickness of the insulating layer 124 decreases, heat is more quickly transmitted to the high temperature expansion layer 112. However, this condition varies according to the materials.

As shown in FIG. 3B, an electric current I1 and an electric current I2 flow, respectively, through the conductive layer 111 and the high temperature expansion layer 112, and the heater layer 110 is not heated because an electric current is not applied thereto.

However, since the current I1 flows through the area 131 of the heater layer 110 that is not covered with the conductive layer 111 in the deflecting region 130 where deflection is caused by the application of the current, the area 131 is heated and deflected in the direction R.

The center points 81 and 82 in the longitudinal direction X of the area 131 in FIG. 3A are placed on the center axis CL of the mirror surface 20, as shown in FIG. 1.

Figure 4:
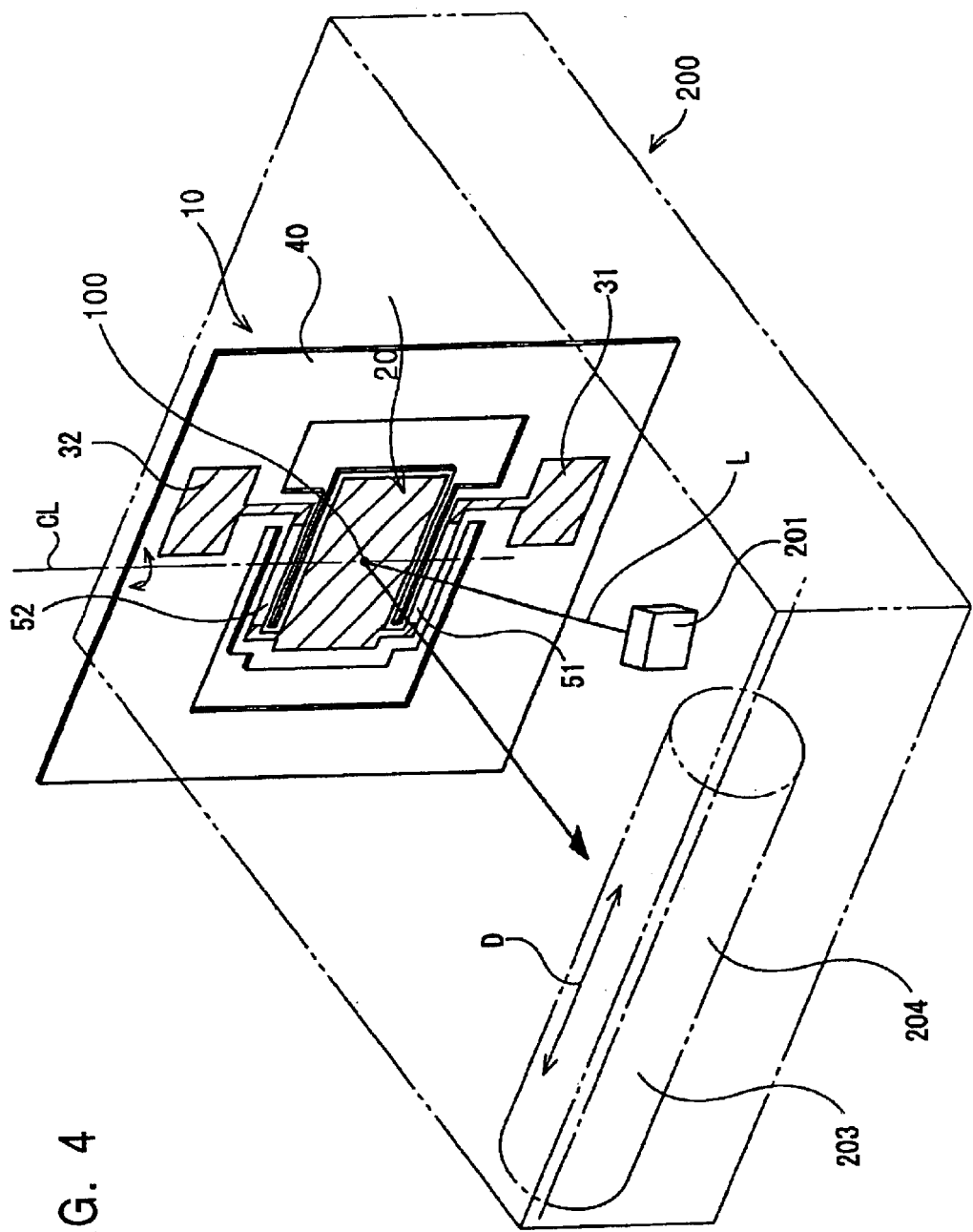
FIG. 4 is a perspective view showing an application of the thermally actuated micro mirror shown in FIG. 1 to an electronic device.

FIG. 4 shows an example in which the thermally actuated micro mirror 10 shown in FIG. 1 is applied to an electronic device 200.

The electronic device 200 is, for example, a laser printer. Laser light L emitted from a laser-light source 201 is reflected at the reflecting position 100 of the mirror surface 20 of the thermally actuated micro mirror 10, and is scanned on a photoconductive member 204 of a rotating drum 203. In this case, the mirror surface 20 tilts about the center axis CL at an arbitrary angle θ.

Figure 5:
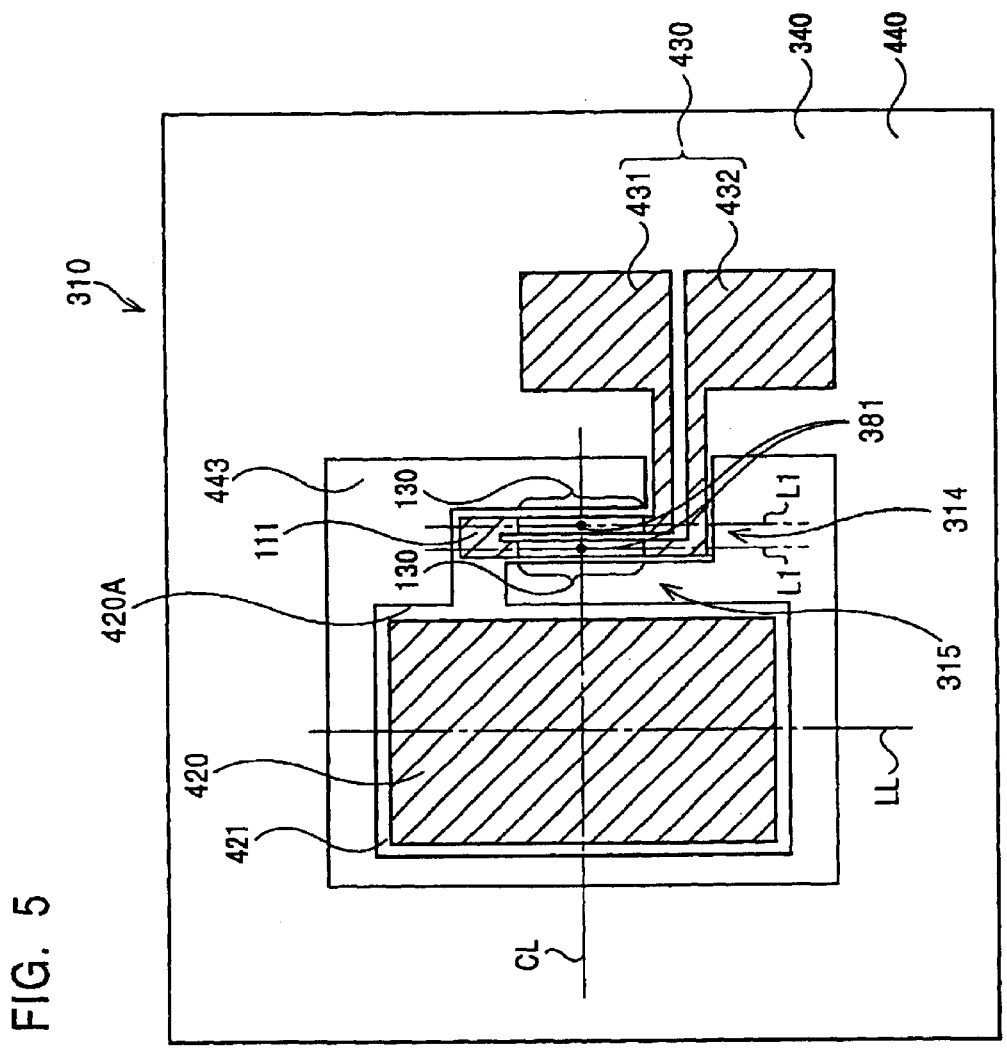
FIG. 5 is a plan view of a thermally actuated micro mirror according to a second embodiment of the present invention.

FIG. 5 shows a thermally actuated micro mirror according to a second embodiment of the present invention. A thermally actuated micro mirror 310 shown in FIG. 5 is supported in a so-called cantilevered manner, and includes a support structure section 314, a mirror surface 420, an electrode section 430, and a fixed section 440.

The mirror surface 420 is placed inside an opening 443 formed in the fixed section 440. The mirror surface 420 is, for example, rectangular, and is formed on a base member 421.

One support structure section 314 is formed between one end 420A of the mirror surface 420 and two electrodes 431 and 432 of the electrode section 430. A support arm 315 in the support structure section 314 has a multilayer structure similar to that of the first support arm 51 and the second arm 52 shown in FIGS. 3A and 3B.

A two-way conductive layer 111 is formed on the support arm 315, and deflecting regions 130 in which deflection is produced are provided in the support arm 315. The deflecting regions 130 are formed parallel to a longitudinal center axis LL of the mirror surface 420. A center axis CL of the mirror surface 420 is perpendicular to longitudinal axes L1 of the support arm 315. Moreover, center points 381 of the longitudinal axes L1 of the support arm 315 are placed on the center axis CL of the mirror surface 420.

In such a configuration, the support arm 314 causes deflection in the deflecting regions 130 by applying electricity from an external power supply to the electrodes 431 and 432, in a manner similar to that shown in FIGS. 3A and 3B. Consequently, an actual turning axis of the mirror surface 420 substantially or exactly coincides with the center axis CL of the mirror surface 420, as shown in FIG. 2. Therefore, a reflecting position 100 for laser light L will not be displaced by changes of the angle θ of the mirror surface 20.

In this case, it is possible to reduce the area of the mirror surface 420, and to reduce the size of the thermally actuated micro mirror 310.

The present invention is not limited to the above embodiments.

The mirror surface 20 and the first and second electrodes 31 and 32 shown in FIG. 1, and the conductive layer 111 and the high temperature expansion layers 112 shown in FIGS. 3A and 3B may be, of course, made not only of aluminum, but also of a conductive material that has a high coefficient of thermal expansion and a high reflectance, for example., gold, silver, magnesium, copper, brass, or duralumin.

As shown in FIG. 5, the conductive layer 111 is formed in the support arm 315 of the support structure section 314, in a manner similar to that in FIGS. 3A and 3B, and includes two paths through which electricity flows to the electrodes 431 and 432. In the second embodiment shown in FIG. 5, the mirror surface 420, the conductive layer 111 of the support arm 315, and the electrodes 431 and 432 may be, of course, made not only of aluminum, but also of gold or the like.

In the first embodiment shown in FIG. 1, the mirror surface 20 is symmetrically and turnably supported by the first support arm 51 and the second support arm 52 placed on both sides thereof. Such a structure allows the mirror surface 20 to be turned stably.

Even when the mirror surface 420 is supported in the fixed section 440 by the support structure section 314 in a cantilevered manner, as shown in FIG. 5, it can sufficiently turn on its geometric center axis CL, that is, on almost the turning axis.

In the above embodiments, the conductive layer 111 is not formed in the deflecting region 130 of the support arm in order to perform heating and causing deflection only in the deflecting region 130. The conductive layer 111 is formed in regions where deflection should not be caused.

Of course, the first support arm 51 and the second support arm 52 shown in FIG. 1 and the support arm 315 shown in FIG. 5 may have a two-layer structure composed of a conductive layer made of aluminum or the like and a heater layer made of an insulating material so that heat is generated over the entire heater layer by the application of electricity to the conductive layer.

The first support arm 51, the second support arm 52, and the support arm 315 shown in FIGS. 1 and 5 may have a multilayer structure made of a shape-memory alloy, chromium, and the like so that they are deflected and straightened by applying electricity thereto. For example, the support arms may have a multilayer structure of chromium and a NiTi alloy so that they can store the shape in a straight state and so that they can be deflected because of a difference in coefficient of thermal expansion at normal temperatures and can be straightened by heat due to the application of electricity.

Figure 6:
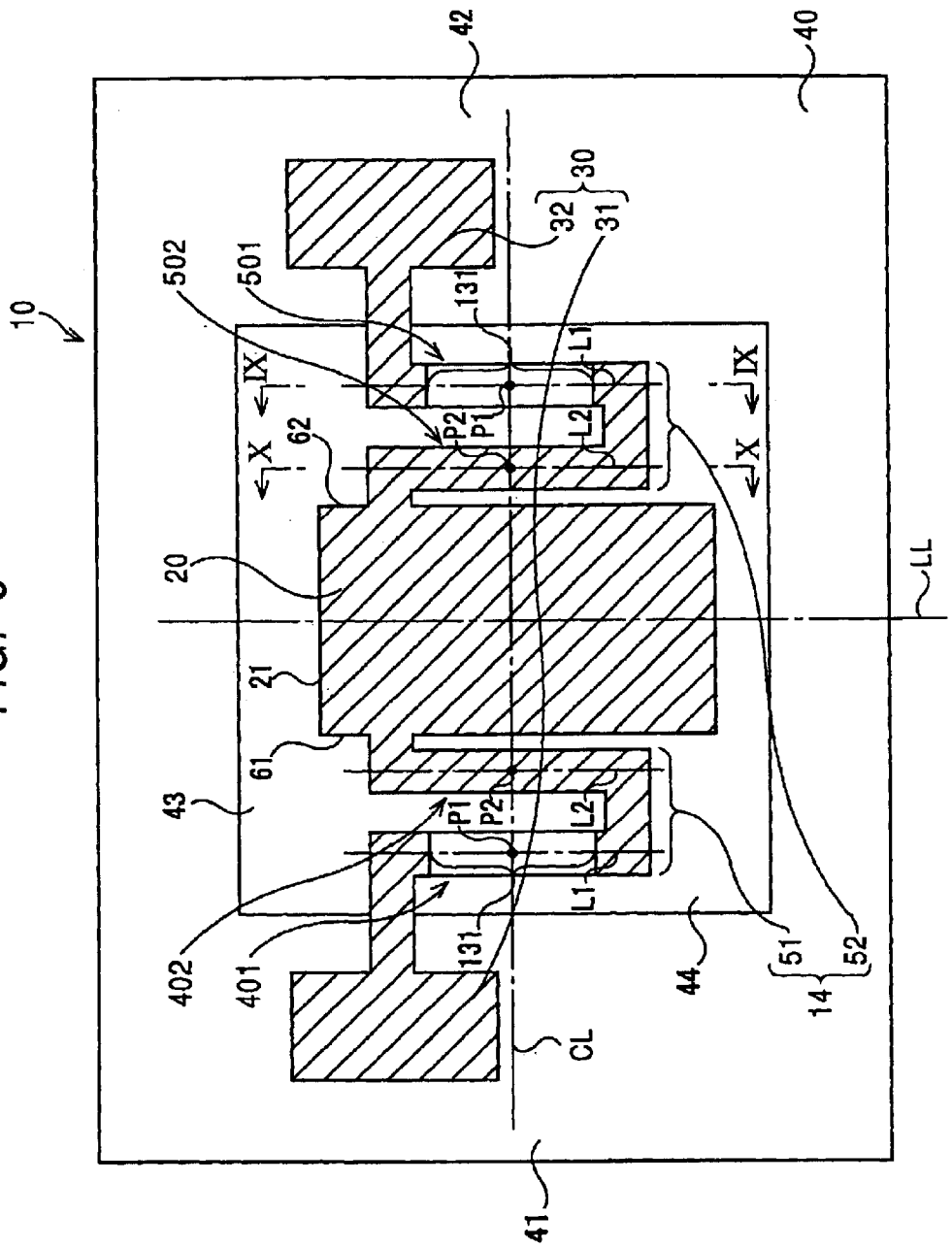
FIG. 6 is a plan view of a thermally actuated micro mirror according to a third embodiment of the present invention.

FIG. 6 shows a thermally actuated micro mirror according to a third embodiment of the present invention. A thermally actuated micro mirror 10 of the third embodiment is similar to the above-described thermally actuated micro mirror 10 of the first embodiment except for the structures of a first support arm 51 and a second support arm 52. In the following, components similar to those in the first embodiment are denoted by the same reference numerals, and detailed descriptions thereof are omitted.

A first support arm 51 and a second support arm 52 of a support structure section 14 shown in FIG. 6 will be described in detail.

The first support arm 51 has a first arm portion 401 and a second arm portion 402. Similarly, the second support arm 52 has a first arm portion 501 and a second arm portion 502.

The first arm portion 401 of the first support arm 51 is placed parallel to the second arm portion 402, and the first arm portion 501 of the second support arm 51 is placed parallel to the second arm portion 502. The first arm portions 401 and 501 and the second arm portions 502 are parallel to a longitudinal center axis LL of a mirror surface 20.

The first arm portions 401 and 501 are deflected by applying electricity from a power supply (not shown) to a first electrode 31 and a second electrode 32 in an electrode section 30. In contrast, the second arm portions 402 and 502 are not deflected by the application of electricity. Longitudinal axes L1 of the first arm portions 401 and 501 and longitudinal axes L2 of the second arm portions 402 and 502 are parallel to the longitudinal center axis LL of the mirror surface 20.

The following characteristic features are adopted so that the center of turning of the mirror surface 20 substantially or completely coincides with the centers of the first support arm 51 and the second support arm 52.

The longitudinal axes L1 of the first arm portions 401 and 501 and the longitudinal axes L2 of the second arm portions 402 and 502 described above are perpendicular to a center axis (also referred to as a center axis of turning) CL of the mirror surface 20. Moreover, center points P1 of the longitudinal axes L1 of the first arm portions 401 and 501 and center points P2 of the longitudinal axes L2 of the second arm portions 402 and 502 are substantially or exactly placed on the center axis CL of the mirror surface 20.

Figure 7:
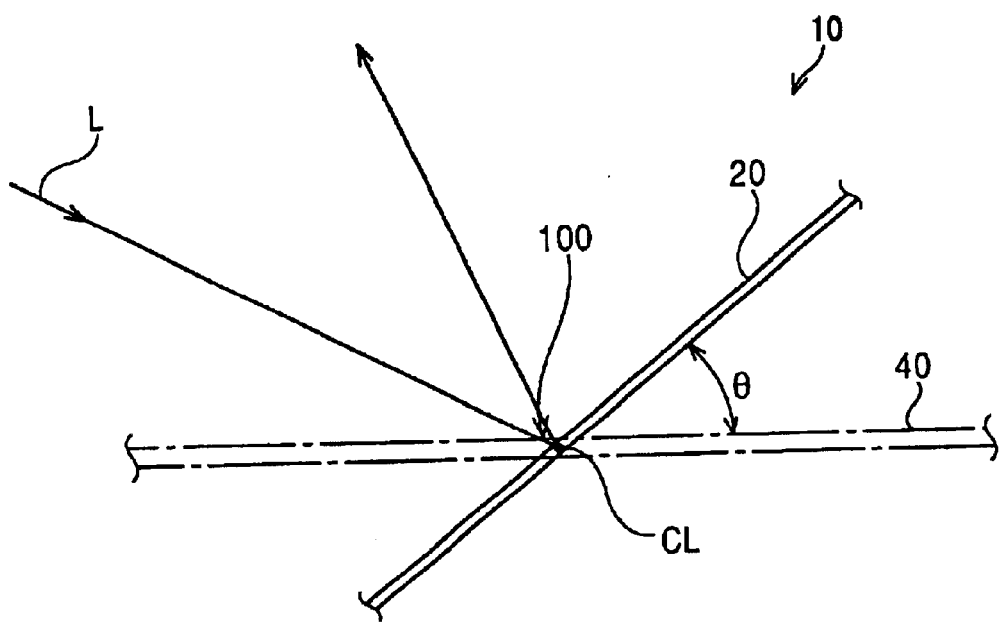
FIG. 7 is an explanatory view showing a state in which a mirror surface of the thermally actuated micro mirror is tilted at an arbitrary angle θ.

Such a structure prevents the turning axis of the mirror surface 20 also serving as the center axis CL from being displaced, regardless of the angle θ of the mirror surface 20. Therefore, when laser light L as an example of light is reflected at a reflecting position 100 of the mirror surface 20, as shown in FIG. 7, the reflecting position 100 is hardly displaced or is not displaced at all, regardless of the angle θ.

While it has been hitherto necessary to make the mirror surface large on the assumption that the reflecting position may be displaced, the size of the mirror surface 20 does not need to be large in the thermally actuated micro mirror 10 of this embodiment, and size reduction of the thermally actuated micro mirror 10 is possible.

In FIG. 6, diagonally shaded portions of the mirror surface 20, the first arm portions 401 and 501, the second arm portions 402 and 502, and the first and second electrodes 31 and 32 are provided with a metal film that is a conductive metal, for example, aluminum or gold.

Therefore, when electricity for thermal driving is applied from the unshown power supply to the first electrode 31 and the second electrode 32, it flows therebetween through the first arm portion 401, the second arm portion 402, the mirror surface 20, the first arm portion 501, and the second arm portion 502.

FIG. 7 shows a state in which the mirror surface 20 is tilted at an arbitrary angle θ when electricity is applied from the power supply to the first electrode 31 and the second electrode 32 in the thermally actuated micro mirror 10 shown in FIG. 6.

Figure 9A:
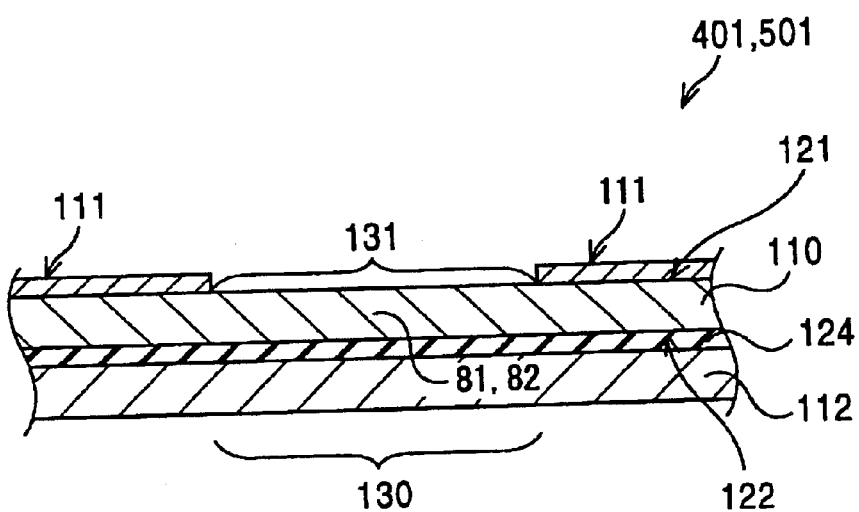
FIGS. 9A and 9B are cross-sectional views showing a multilayer structure of a first arm portion, taken along line IX—IX in FIG. 6.
Figure 9B:
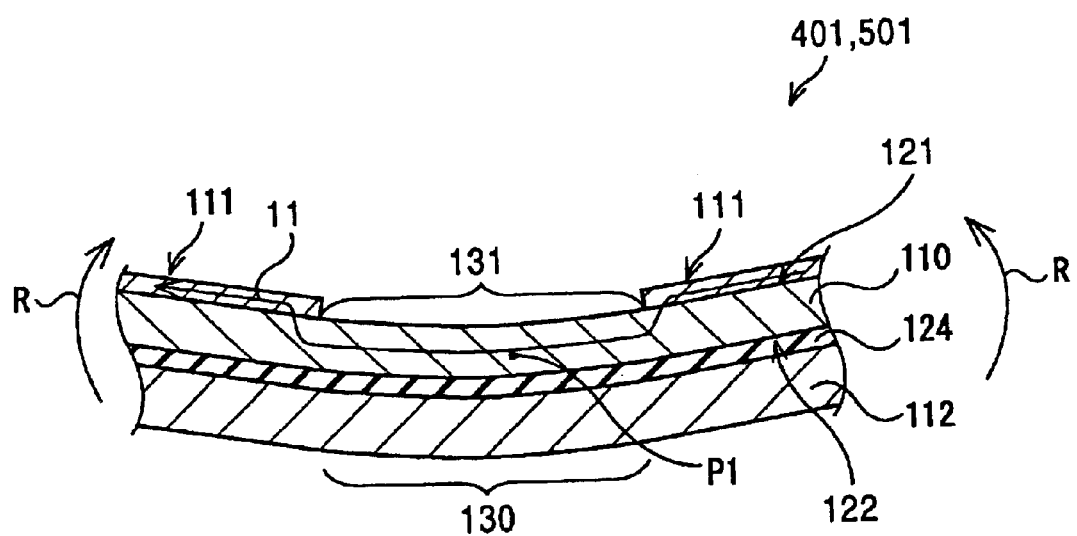

In this case, the first arm portion 401 of the first support arm 51 and the first arm portion 501 of the second support arm 52 are simultaneously deflected in the same direction, that is, in the direction R in FIG. 9B by the application of electricity. The center point P1 of the first arm portion 401 and the center point P1 of the first arm portion 501 shown in FIG. 6 may be substantially or exactly placed on the center axis CL of the mirror surface 20.

The center axis CL is also referred to as the "center axis of turning" or as the "turning axis".

FIG. 7 shows that the center axis (turning axis) CL of the mirror surface 20 is hardly displaced even when the angle θ of the mirror surface 20 changes. When the first support arm 51 and the second support arm 52 shown in FIG. 6 are deflected in the shape of a substantially perfect arc in the same direction R by the application of electricity, the turning axis of the mirror surface 20 coincides with the center axis CL.

While the first arm portion 401 of the first support arm 51 with the second arm portion 402 and the first arm portion 501 of the second support arm 52 with the second arm portion 502 will, in actuality, not deflect in the shape of a perfect arc because of the distribution of heat in the multilayer structure and variations of the characteristics of the used materials, the first support arm 51 and the second support arm 52 seem to deform in the shape of a substantially perfect arc. Therefore, when the mirror surface 20 actually turns, the turning axis of the mirror surface 20 substantially or completely coincides with the geometric center axis CL, and does not greatly deviate therefrom.

For example, when laser light L as an example of light is applied to the center axis CL, a reflecting position 100 of the laser light L is rarely displaced on the mirror surface 20.

Conversely, since the reflecting position 100 of the laser light L is not displaced, a reflecting surface of the mirror surface 20 does not need to be large on the assumption that the reflecting position 100 may be displaced. This minimizes the area of the mirror surface 20, and reduces the size of the thermally actuated micro mirror 10.

The thermally actuated micro mirror 10 of the third embodiment adopts the following features in order to prevent the initial position of the mirror surface 20 from being affected by changes in ambient temperature.

The initial position of the mirror surface 20 means a position in which the mirror surface 20 is placed in the plane of a fixed section 40, as shown in FIG. 6.

In the thermally actuated micro mirror 10, the first arm portions 401 and 501 that are heated and intentionally deformed by the application of electricity and the second arm portions 402 and 502 that are not intentionally disabled from deforming are arranged in parallel, and are connected at their ends. The arm portions that are thermally actuated are deformed like a bimetal by a difference in coefficient of thermal expansion produced by an increase in temperature due to heat generation. For this reason, the arm portions are not only by intentional heat generation, such as application of electricity, but also by a change in ambient temperature. Mobile devices suffer changes in ambient temperature from below −10° C. to above +50° C., and the changes significantly change the angle of the thermally-deformed arm portions. This means that the initial angle of the mirror depends on changes in ambient temperature when electricity is not applied, and the mirror angle is not maintained precisely.

One countermeasure against the above problem is to arbitrarily set the initial angle of the mirror surface by applying a direct-current bias voltage to the arm portions. While the above problem seems to be overcome by this method, the bias current for maintaining the initial position considerably increases the power consumption, and a detector for detecting the initial position of the mirror surface is required.

Accordingly, instead of the above method, the third embodiment adopts the following structures to prevent the initial position of the mirror surface 20 from being affected by changes in ambient temperature.

In the thermally actuated micro mirror 10 shown in FIG. 6, the first support arm 51 includes the first arm portion 401 and the second arm portion 402 parallel to each other, and the second support arm 52 includes the first arm portion 501 and the second arm portion 502 parallel to each other.

When the first arm portion 401 deflects because of a change in ambient temperature, the second arm portion 402 deflects in the same direction to intentionally compensate for the deflection of the first arm portion 401.

Similarly, when the first arm portion 501 deflects because of a change in ambient temperature, the second arm portion 502 deflects in the same direction to intentionally compensate for the deflection of the first arm portion 501.

Figure 8:
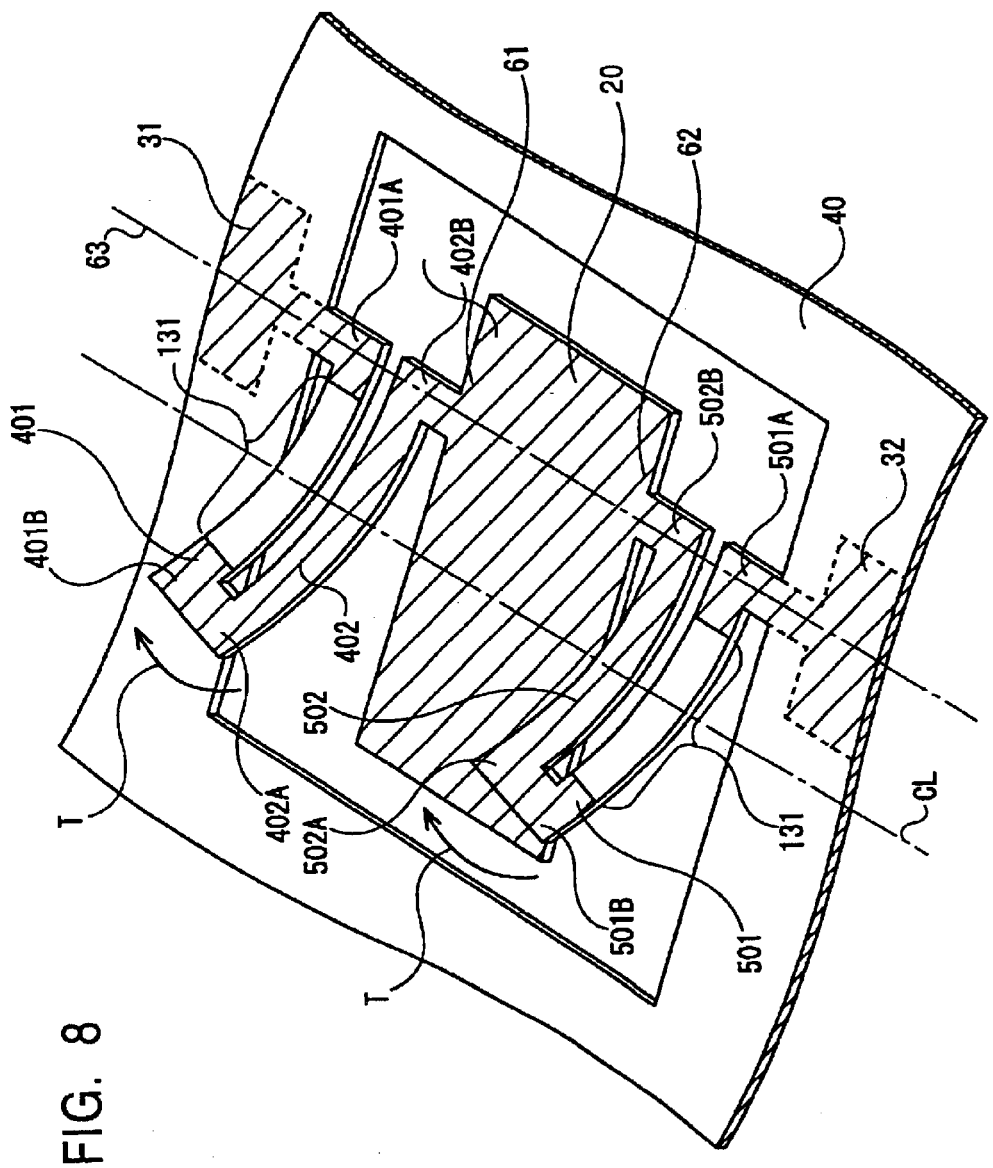

FIG. 8 shows a state in which both the first arm portions 401 and 501 and the second arm portions 402 and 502 are deflected in the direction T by a change in internal stress or a change in ambient temperature.

The first arm portions 401 and 501 and the second arm portions 402 and 502 shown in FIGS. 6 and 8 have a multilayer structure.

Figure 10:
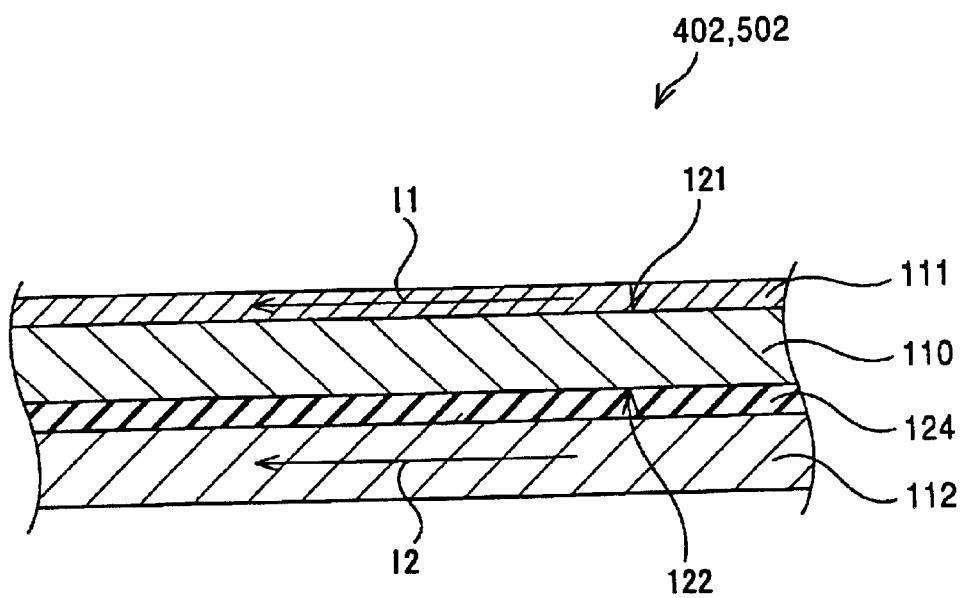
FIG. 10 is a cross-sectional view showing a multilayer structure of a second arm portion, taken along line X—X in FIG. 6.

FIGS. 9A and 9B show an example of a multilayer structure of the first arm portions 401 and 501, and FIG. 10 shows an example of a multilayer structure of the second arm portions 402 and 502.

Referring to FIG. 8, one end 401A of the first arm portion 401 is connected to the electrode 31 in the fixed section 40. The other end 401B of the first arm portion 401 is connected to one end 402A of the second arm portion 402, and the other end 402B of the second arm portion 402 is connected to an end 61 of the mirror surface 20.

Similarly, one end 501A of the first arm portion 501 is connected to the electrode 32 in the fixed section 40. The other end 501B of the first arm portion 501 is connected to one end 502A of the second arm portion 502, and the other end 502B of the second arm portion 502 is connected to an end 62 of the mirror surface 20.

The one end 401A of the first arm portion 401, the other end 402B of the second arm portion 402, the one end 501A of the first arm portion 501, and the other end 502B of the second arm portion 502 are placed on a straight line 63 parallel to the center axis CL of the mirror surface 20.

Next, an example of a multilayer structure of the first arm portions 401 and 501 will be described with reference to FIGS. 9A and 9B.

FIGS. 9A and 9B are cross-sectional structural views of the first arm portion 401 (501), taken along line IX—IX in FIG. 6. FIG. 10 is a cross-sectional structural view of the second arm portion 402 (502), taken along line X—X in FIG. 6.

By applying electricity to the first arm portion 401 (501) in a state shown in FIG. 9A, the first arm portion 401 (501) deflects in the direction R, as shown in FIG. 9B. By the deflection of the first arm portion 401 (501) in the direction R, the mirror surface 20 can be tilted at an arbitrary angle θ, as shown in FIG. 7.

The first arm portion 401 and the first arm portion 501 are placed close to the electrodes in the fixed section 40 and apart from the mirror surface 20, as shown in FIG. 6. The first arm portion 401 and the first arm portion 501 have a similar multilayer structure, and each include a heater layer 110, a conductive layer 111, and a high temperature expansion layer 112.

The heater layer 110 is an electric resistor made of, for example, doped ρ-Si. A relatively thin conductive layer 111 is formed on one surface 121 of the heater layer 110. A relatively thick high temperature expansion layer 112 is formed on the other surface 122 of the heater layer 110 with an insulating layer 124 therebetween.

The conductive layer 111 and the high temperature expansion layer 112 are made of a metal that conducts electricity, for example, aluminum or gold. The conductive layer 111 is thinner than the high temperature expansion layer 112. The conductive layer 111 is not formed in an area 131 of the one surface 121 of the heater layer 110 corresponding to a deflecting region 130 where deflection is produced, and the one surface 121 is exposed therefrom. Such areas 131 are unhatched and centered on the center points P1 along the longitudinal axes L1 in FIG. 6.

Such multilayer structures of the first support arm 51 and the second support arm 52 are formed to provide the deflecting regions 130 corresponding to the areas 131.

The insulating layer 124 may be made of, for example, $Si_3N_4$, and serves to electrically insulate the heater layer 110 and the high temperature expansion layer 112.

When electricity is applied to the conductive layer 111, the high temperature expansion layer 112, and the heater layer 110, the deflecting region 130 is deflected in the direction R because of a difference in coefficient of thermal expansion between the conductive layer 111 and the high temperature expansion layer 112 of aluminum, and the heater layer 110, as shown in FIG. 9B. The coefficient of thermal expansion of aluminum of the conductive layer 111 and the high temperature expansion layer 112 is $2.3 \times 10^{-6}$/K, and the coefficient of thermal expansion of doped ρ-Si is 2.3×10⁻⁵/K. The coefficients of thermal expansion of the two materials are different by one digit. The first arm portion 401 and 501 are heated by applying electricity to the heater layer 110 of doped ρ-Si.

The thickness of the insulating layer 124 is sufficiently less than those of the heater layer 110 and the high temperature expansion layer 112. The reason of this is as follows. Since the coefficients of thermal expansion of the insulating layer 124 and the heater layer 110 are similar, and, great deflection is achieved when the total thickness of the insulating layer 124 and the heater layer 110 is similar to that of the high temperature expansion layer 112. In order to reduce the driving voltage of the heater layer 110, it is preferable that the resistance of the heater layer 110 be low, and that the thickness of the heater layer 110 be as large as possible. When the heater layer 110 is thick, the insulating layer 124 must be thin. As the thickness of the insulating layer 124 decreases, heat is more quickly transmitted to the high temperature expansion layer 112. However, this condition varies according to the materials.

As shown in FIG. 9B, when electricity is applied, a current I1 flows through the conductive layer 111, and therefore, does not flow through the heater layer 110 on which the conductive layer 111 is formed. Consequently, the heater layer 110 is not heated.

However, since the conductive layer 111 is not formed on the area 131 of the heater layer 110, the current I1 flows through the area 131 in the deflecting region 130, the area 131 is heated, and the deflecting region 130 is deflected in the direction R.

The center point P1 in the longitudinal direction X of the area 131 in FIG. 9B is placed on the center axis CL of the mirror surface 20, as shown in FIG. 6.

In contrast, the multilayer structure of the second arm portions 402 and 502 shown in FIG. 10 does not include the area 131 where the conductive layer 111 is not formed corresponding to the deflecting region 130 in FIGS. 9A and 9B. That is, a conductive layer 111 is formed on the entirety of one surface 121 of a heater layer 110, and a high temperature expansion layer 112 is formed on the entirety of the other surface 122 of the heater layer 110 with an insulating layer 124 therebetween.

In the second arm portions 402 and 502, the high temperature expansion layer 112 is thicker than the conductive layer 111. The reason of this is as follows. The high temperature expansion layer 112 provides a bimetal effect, and preferably, the thickness thereof is similar to the total thickness of the insulating layer 124 and the heater layer 110, that is, approximately 1 μm. In contrast, the conductive layer 111 serves to conduct electricity, and it is satisfactory as long as the conductive layer 111 is made of metal and has a thickness of approximately 100 nm.

Figure 11:
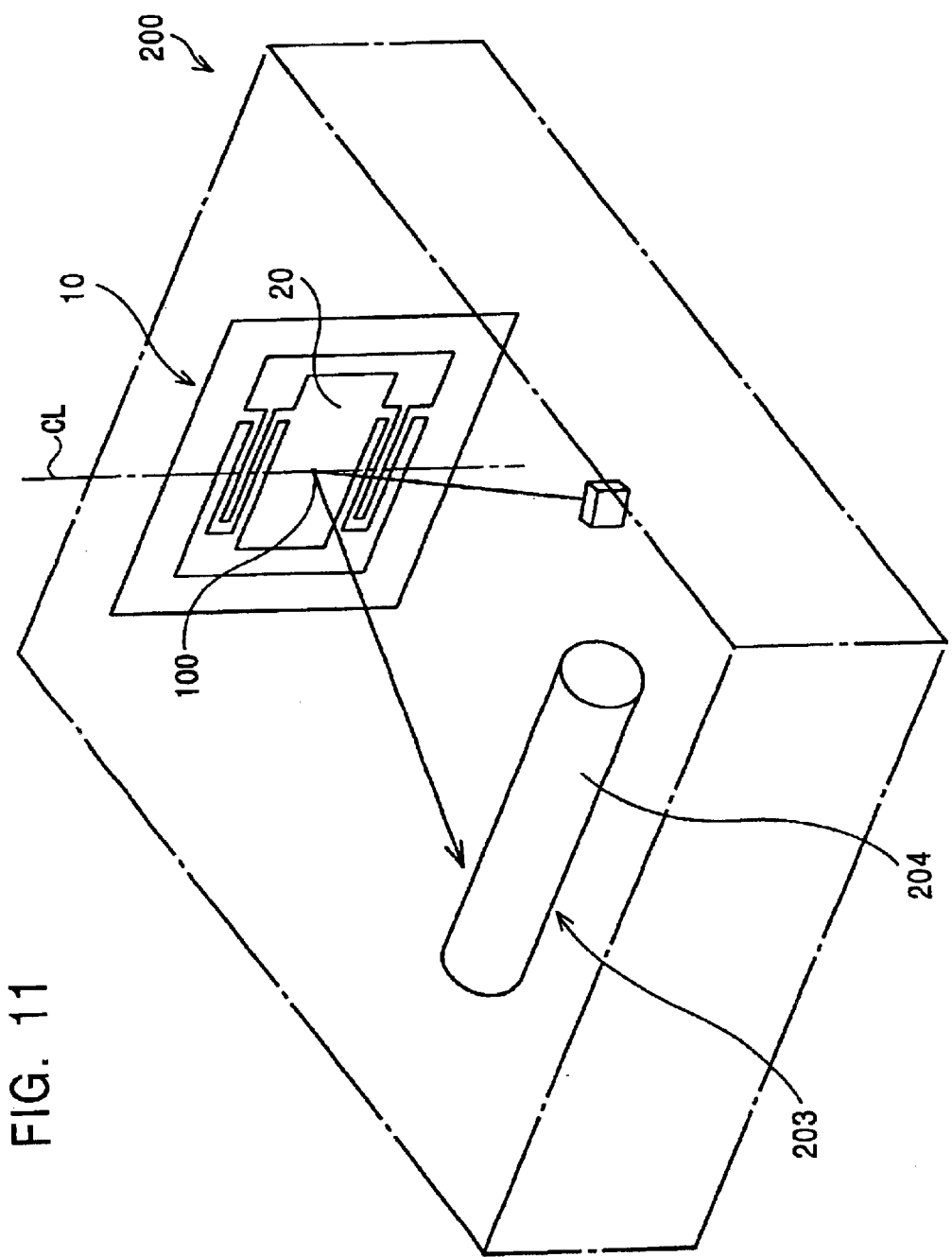
FIG. 11 is a perspective view showing an example in which the thermally actuated micro mirror of the present invention is applied to an electronic device.

FIG. 11 shows an example in which the thermally actuated micro mirror 10 shown in FIG. 6 is applied to an electronic device 200.

The electronic device 200 is, for example, a laser printer. Laser light L emitted from a laser-light source 201 is reflected at the reflecting position 100 of the mirror surface 20 of the thermally actuated micro mirror 10, and is scanned on a photoconductive member 204 of a rotating drum 203. In this case, the mirror surface 20 is tilted about the center axis CL at an arbitrary angle θ.

A description will be given of the reason why the initial angle of the mirror surface 20 in the thermally actuated micro mirror 10 is maintained without being affected by changes in ambient temperature.

The second arm portions 402 and 502 are intentionally added to the first arm portions 401 and 501 that causes deflection by the application of electricity. The second arm portions 402 and 502 prevent the first arm portions 401 and 501 from being deflected by a change in ambient temperature, and as a result, hold the mirror surface 20 at the initial position (initial angle).

The first arm portions 401 and 501 have a similar multilayer structure, and the second arm portions 402 and 502 have another similar multilayer structure. In this way, the second arm portion 402 is provided to compensate for deflection of the first arm portion 401 due to changes in ambient temperature or residual internal stress, and the second arm portion 502 is provided to compensate for deflection of the first arm portion 501 due to changes in ambient temperature or residual internal stress.

When the micro mirror 10 is heated by, for example, an increase in ambient temperature, a pair of the first arm portion 401 and the second arm portion 402 and a pair of the first arm portion 501 and the second arm portion 502 are deflected together in the same direction T, as shown in FIG. 8. In particular, since the coefficient of thermal expansion of the high temperature expansion layer 112 is higher than that of the heater layer 110, as shown in FIGS. 9 and 10, the pair of the first arm portion 401 and the second arm portion 402 and the pair of the first arm portion 501 and the second arm portion 502 are deflected in the direction T, as shown in FIG. 8.

In this case, the one end 401A of the first arm portion 401, the other end 402B of the second arm portion 402, the one end 501A of the first arm portion 501, and the other end 502B of the second arm portion 502 are placed along the straight line 63, as shown in FIG. 8, deflection of the first arm portion 401 due to a change in ambient temperature can be compensated for by deflection of the second arm portion 402 due to the change in ambient temperature. Simultaneously, deflection of the first arm portion 501 due to a change in ambient temperature can be compensated for by deflection of the second arm portion 502 due to the change in ambient temperature.

Therefore, the initial angle of the mirror surface 20 is substantially fixed, regardless of the ambient temperature. This also allows the initial angle to be maintained when the arms are deflected by a difference in internal stress caused by forming the first arm portions and the second arm portions in a multilayer structure. By causing the first arm portion 401 or 402 and the arm portion 501 or 502 on one side of the mirror surface 20 to be deflected by the application of electricity, the mirror angle can be changed by the application of electricity.

When the mirror surface 20 is actually tilted at an arbitrary angle θ, as shown in FIG. 7, the first arm portion 401 and the first arm portion 501 are deflected in the direction R by applying electricity from the power supply to the first electrode 31 and the second electrode 32, as shown in FIG. 9B.

Arm portions that are deflected by the application of electricity shown in FIGS. 6 and 8 may be placed on the side of the fixed section 40, that is, close to the first electrode 31 and the second electrode 32, or on the side of the mirror surface 20.

Preferably, the first arm portion 401 close to the first electrode 31 and the first arm portion 501 close to the second electrode 32 are deflected by the application of electricity, as shown in FIGS. 6 and 8. The reason for that will be described with reference to FIGS. 12 and 13.

Figure 12A:
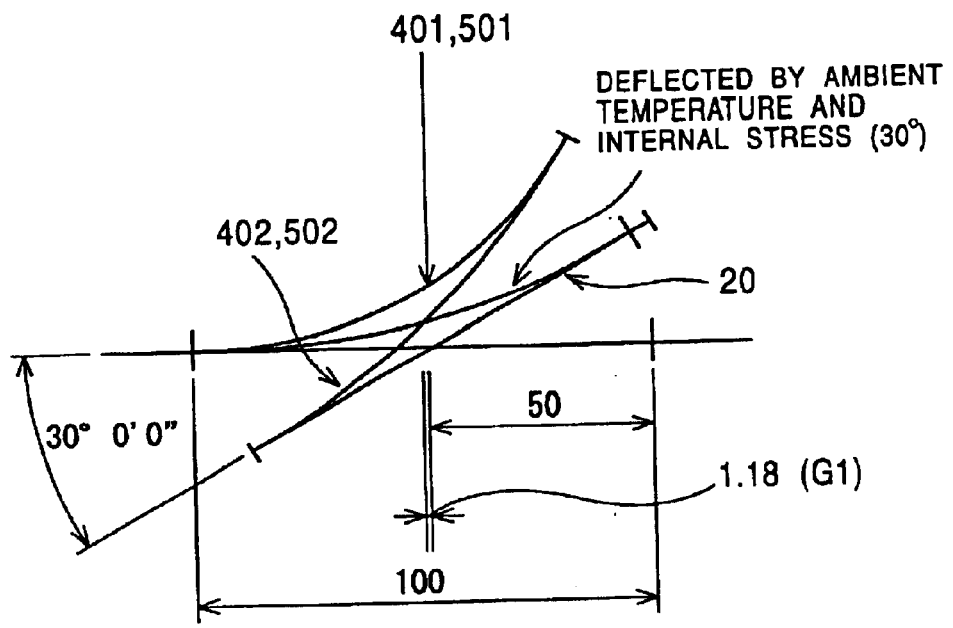
FIGS. 12A and 12B are explanatory views showing the moving distance of the mirror surface when the first arm portions close to a fixed section are deflected by the application of electricity.
Figure 12B:
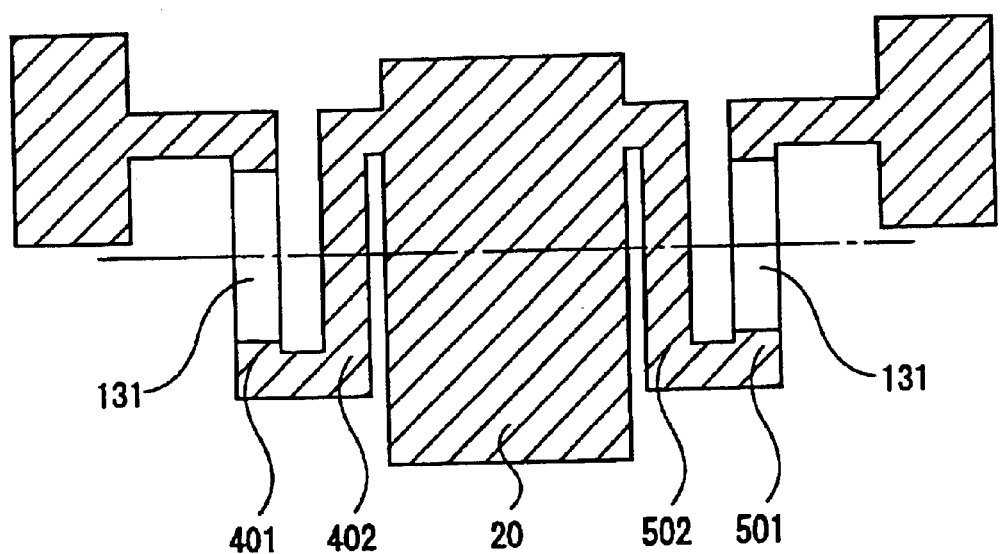

FIGS. 12A and 12B show a moving distance G1 of the turning axis of the mirror surface 20 when the first arm portions 401 and 501 are deflected by the application of electricity, as shown in FIGS. 6 and 8. In contrast, FIGS. 13A and 13B show a moving distance G2 of the turning axis of the mirror surface 20 when the second arm portions 402 and 502 close to the mirror surface 20 are deflected by the application of electricity.

Figure 13A:
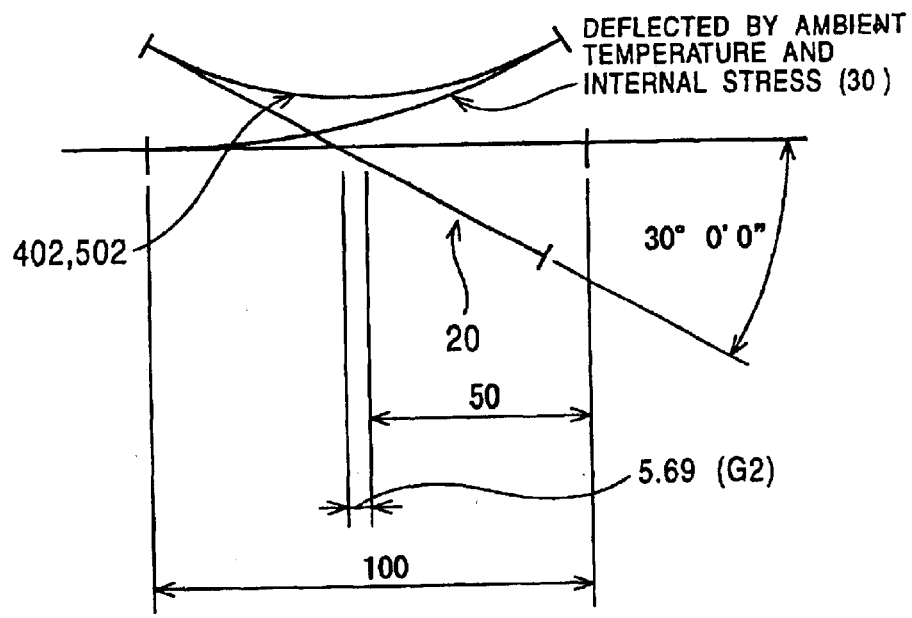
FIGS. 13A and 13B are explanatory views showing the moving distance of the mirror surface when the second arm portions close to the mirror surface are deflected by the application of electricity.
Figure 13B:
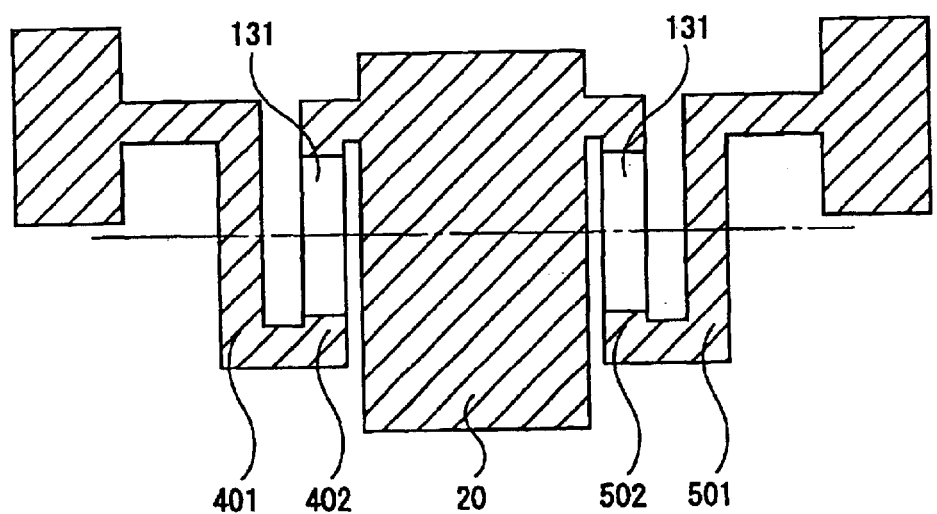
Figure 15A:
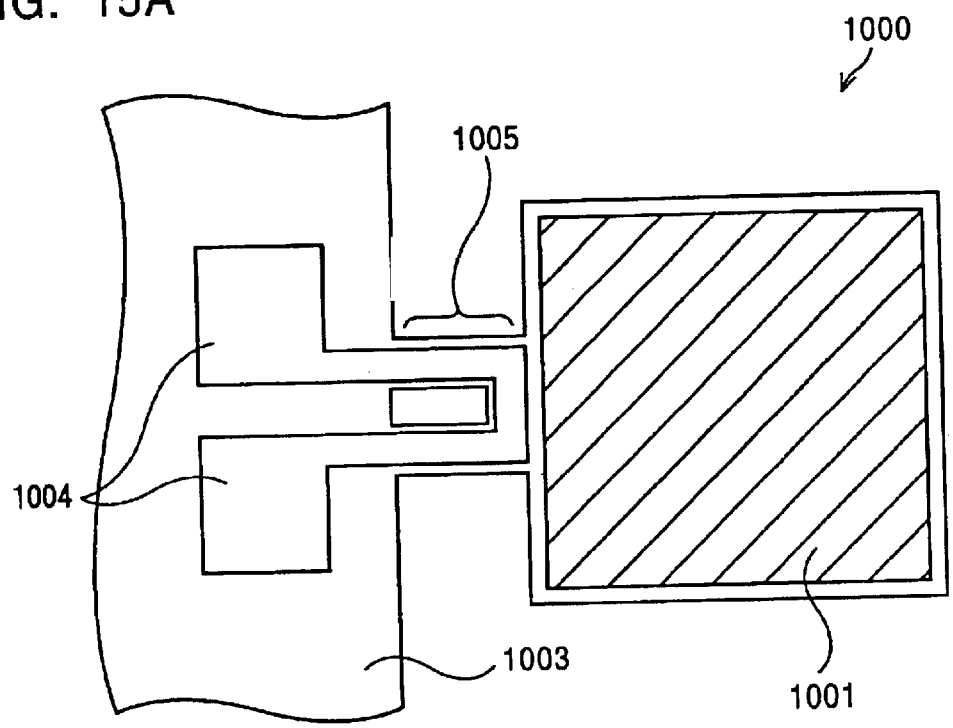
FIGS. 15A and 15B are a plan view and a side view, respectively, of a known thermally actuated micro mirror.
Figure 15B:
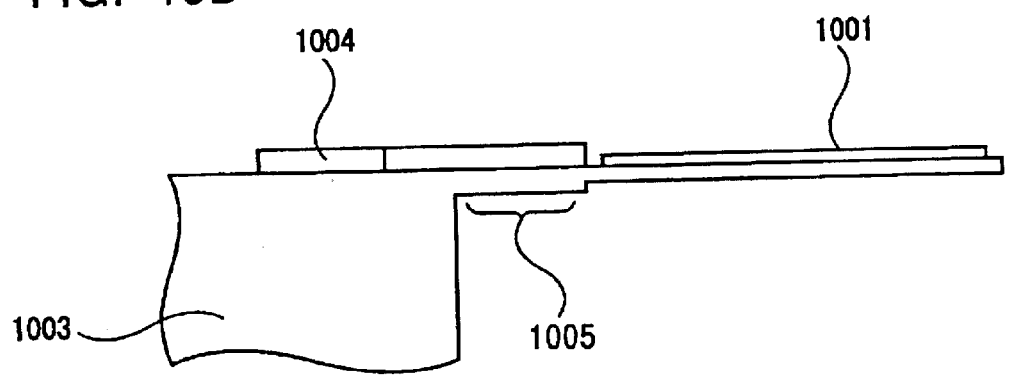
Figure 16:
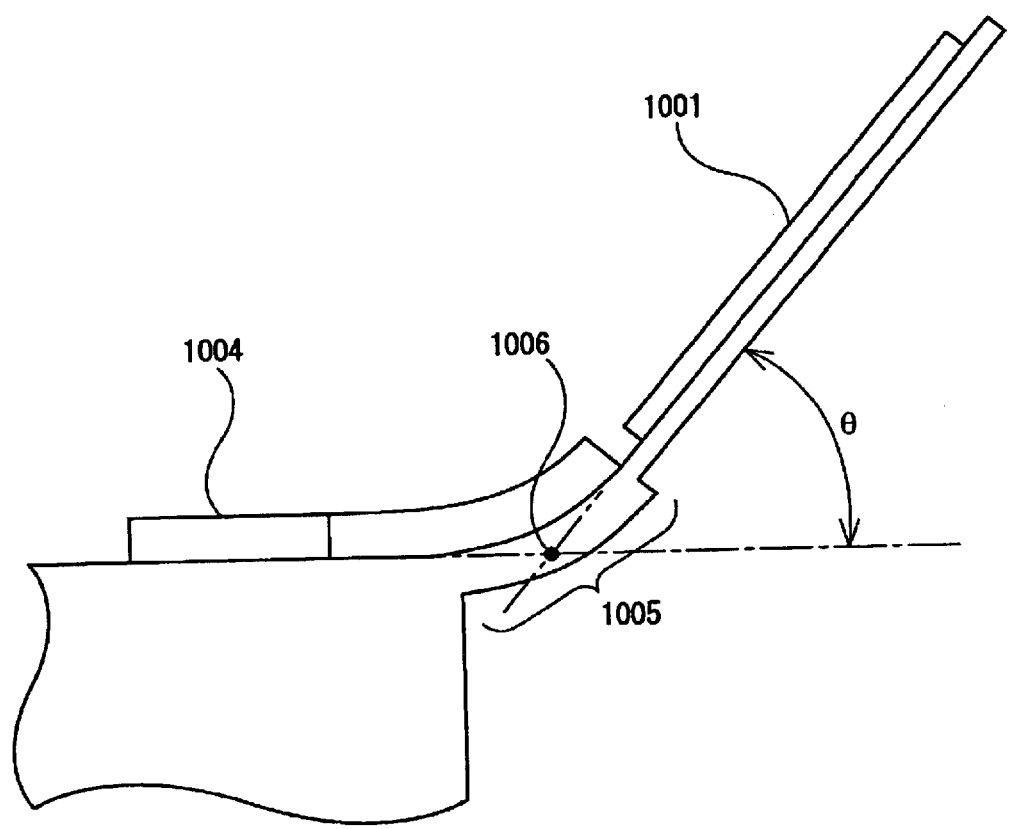
FIG. 16 is an explanatory view showing a state in which a mirror surface of the thermally actuated micro mirror shown in FIG. 15B is tilted.
Figure 17B:
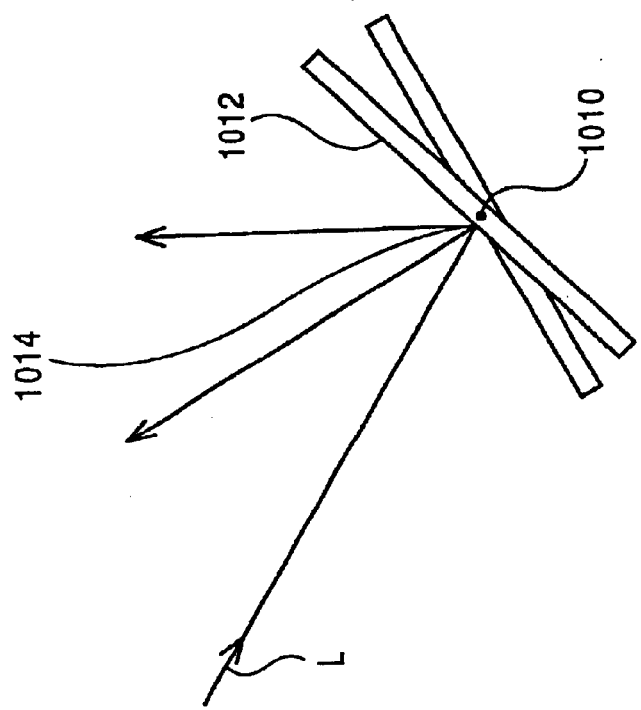
FIGS. 17A and 17B are explanatory views, respectively, showing a case in which the turning axis of the mirror surface is displaced and a case in which the turning axis is not displaced.
Figure 17A:
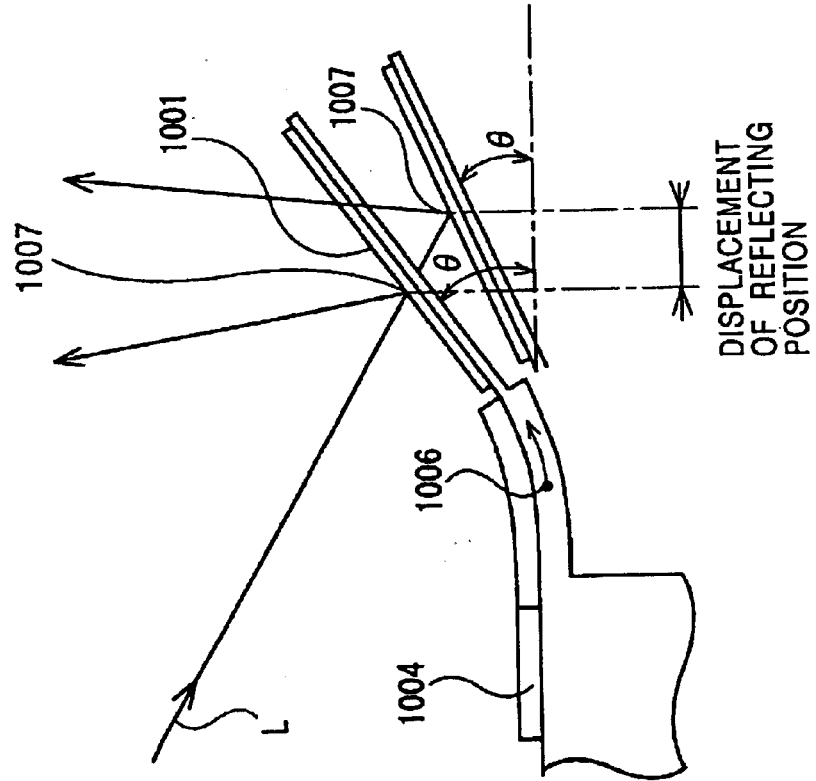
Figure 18:
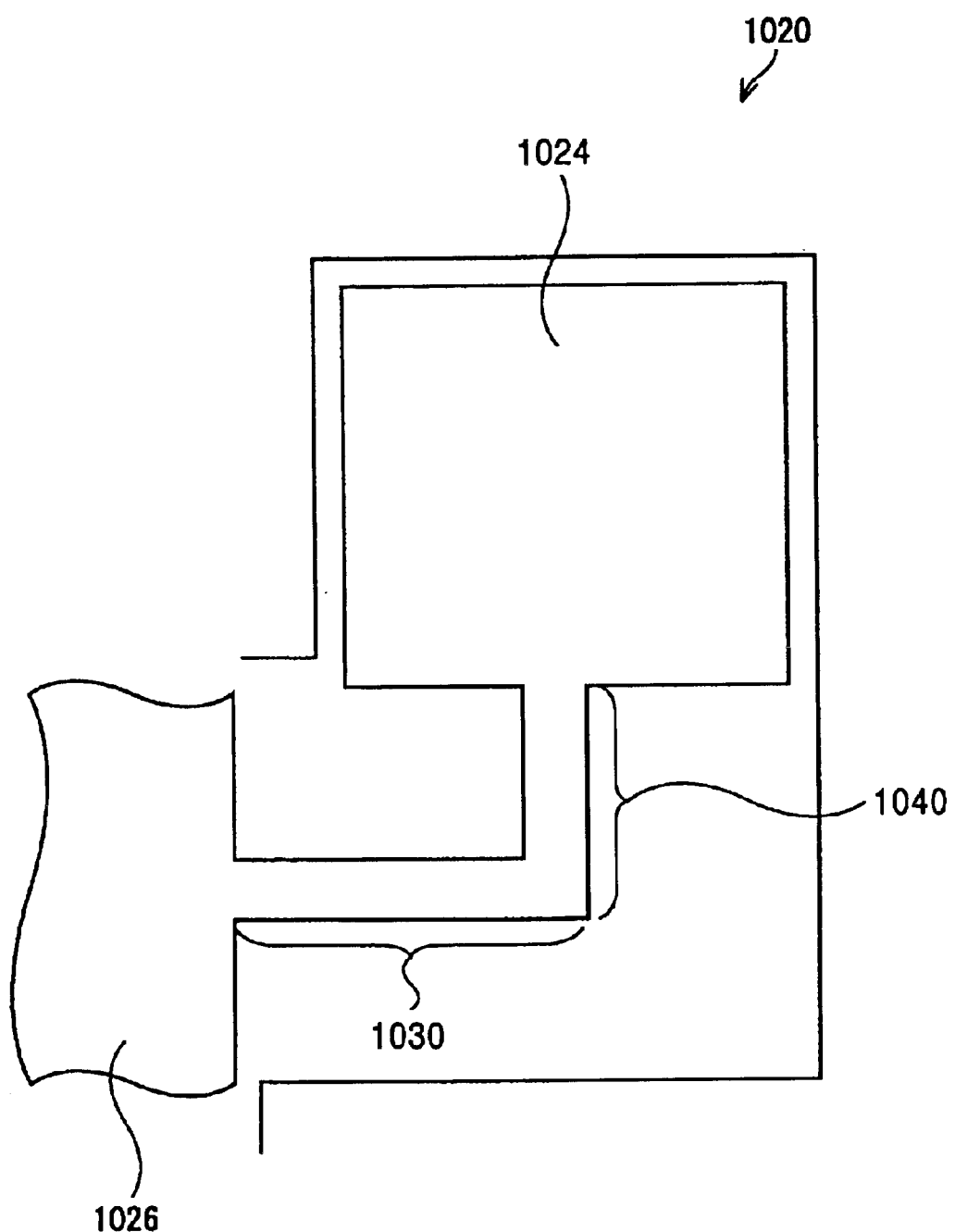
FIG. 18 is a plan view of another known thermally actuated micro mirror.

That is, the first arm portions 401 and 501 are deflected by the application of electricity in FIGS. 12A and 12B, and the second arm portions 402 and 502 are deflected by the application of electricity in FIGS. 13A and 13B.

In a preferred example shown in FIG. 12B, the angle of deflection due to a change in ambient temperature or internal stress is 30°, and the angle of deflection due to the application of electricity is 30°, as shown in FIG. 12A. That is, the first arm portions 401 and 501 are deflected by 60°, and the second arm portions 402 and 502 close to the mirror surface 20 are deflected by 30°. The angle of the mirror surface 20 is 30°. When it is assumed that the arm length and the mirror length are set at 100, the displacement of the turning axis of the mirror surface 20 is 1.18.

In contrast, in an example shown in FIG. 13A, the angle of deflection due to a change in ambient temperature or internal stress is 30°, and the angle of deflection due to the application of electricity is 30°. That is, the first arm portions 401 and 501 close to the fixed section 40 are deflected by 30°. When the second arm portions 402 and 502 close to the mirror surface 20 are deflected by more 30° by the application of electricity, they are finally deflected by 60°. The angle of the mirror surface 20 is 30°. In this case, the displacement of the turning axis of the mirror surface 20 is 5.69.

As a result, the displacement (moving distance) of the turning axis of the mirror surface 20 in FIG. 13A is a little less than five times the displacement in FIG. 12A. For this reason, it is preferable that the first arm portions 401 and 501 close to the fixed section 40 be deflected by the application of electricity, as shown in FIG. 12B.

FIG. 14 shows a thermally actuated micro mirror according to a fourth embodiment of the present invention.

A thermally actuated micro mirror 10 shown in FIG. 14 includes a mirror surface 420, a support structure section 414, an electrode section 430, and a fixed section 440.

The structure of the mirror surface 420 is substantially similar to that of the mirror surface 20 in the third embodiment shown in FIG. 6. The fixed section 440 is also similar to the fixed section 40 of the third embodiment.

The mirror surface 420 is supported for one electrode 431 of the electrode section 430 by the support structure section 414 in a so-called cantilevered manner. The support structure section 414 has one support arm 451. In FIG. 14, the support arm 451 includes two first arm portions 401 that are deflected by the application of electricity, and two second arm portions 402 that are not deflected by the application of electricity. The first arm portions 401 and the second arm portions 402 are alternately connected to each other.

As shown in FIG. 14, one of the first arm portions 401 is placed close to the electrode 431 of the fixed section 440, and the other is interposed between the two second arm portions 402. Both the first arm portions 401 that are deflected by the application of electricity are placed in the odd-numbered positions from the electrode 431, and the second arm portion 402 are placed in the even-numbered positions from the electrode 431.

While the first arm portions 401 and the second arm portions 402 are provided in two pairs in FIG. 14, of course, the number of pairs may be three or more. By thus increasing the number of the first arm portions and the second arm portions, the influence of changes in ambient temperature and internal stress can be reduced.

In order to inhibit the turning axis of the mirror surface 420 from being displaced when the mirror surface 420 is tilted, it is preferable that at least one of the first arm portions 401 disposed at the odd-numbered positions E1 and E3 in FIG. 14 be deflected by the application of electricity.

In the third embodiment shown in FIG. 6, the mirror surface 20 is supported by the first support arm 51 and the second support arm 52 disposed on both sides thereof so that it can turn symmetrically. Such a structure allows the mirror surface 20 to be turned stably.

Even when the mirror surface 420 is supported inside the fixed section 440 by the support structure section 314 in a cantilevered manner, as shown in FIG. 14, it can turn on its geometric center axis CL, that is, on almost the turning center thereof.

In the above embodiments, the conductive layer 111 is not formed in the deflecting region 130 of the support arm in order to perform heating and causing deflection only in the deflecting region 130. The conductive layer 111 is formed in regions where deflection should not be caused.

The first arm portions and the second arm portions shown in FIG. 14 may be provided on both sides of the mirror surface 20 shown in FIG. 6.

Of course, the first support arm 51 and the second support arm 52 shown in FIG. 6 and the support arm 451 shown in FIG. 14 may have a two-layer structure composed of a conductive layer made of aluminum or the like and a heater layer made of an insulating material so that heat is generated over the entire heater layer by the application of electricity to the conductive layer.

The first support arm 51, the second support arm 52, and the support arm 451 shown in FIGS. 6 and 14 may have a multilayer structure made of a shape-memory alloy, chromium, and the like so that they are deflected and straightened by applying electricity thereto. For example, the support arms may have a multilayer structure of chromium and a NiTi alloy so that they can store the shape in a straight state and so that they can be deflected because of a difference in coefficient of thermal expansion at normal temperatures and can be straightened by heat due to the application of electricity.

With the use of the thermally actuated micro mirror of the above embodiments, the turning axis of the mirror surface is hardly displaced or is not displaced at all during turning, and the reflecting position for reflecting light, such as laser light, is hardly displaced or is not displaced at all. For this reason, such a thermally actuated micro mirror can be easily incorporated in various optical systems of, for example, laser printers and optical scanners such as laser scanners, or in other electronic devices.

In the thermally actuated micro mirror of the present invention, the support arm in the support structure section, also called a thermally actuated arm, is deflected like a bimetal by being caused by the application of electricity to generate heat. The angle of the mirror surface supported by the support arm can thereby be arbitrarily changed. In this case, the turning axis of the mirror surface is hardly displaced or is not displaced at all, and therefore, the structure of the optical system is simplified. While the size of the mirror surface is large so that light, such as laser light, is not missed in the prior art, since the turning axis of the mirror surface is hardly displaced or is not displaced at all in the above embodiments, the size of the mirror surface does not need to be large, and the size of the thermally actuated micro mirror can be reduced.

Furthermore, the displacement of the turning axis of the mirror surface is reduced, and the thermally actuated micro mirror is easily assembled into the optical system. By providing the arm portions that deflect by the application of electricity and the arm portions that do not deflect, the angle of the mirror is hardly changed by changes in ambient temperature, and deflection of the arm portions can be compensated for, regardless of internal stress in the materials of the layers deposited in the thermally actuated micro mirror.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A thermally actuated micro mirror comprising:
   a mirror surface; and
   a support structure section having a multilayer structure to support the mirror surface,
   wherein the mirror surface is tilted by the deflection of the support structure section caused by a difference in coefficient of thermal expansion in the multilayer structure due to heat generated in the support structure section by the application of electricity,
   wherein the support structure section is disposed between the mirror surface and an electrode section for applying the electricity, and
   wherein a longitudinal axis of the support structure section is perpendicular to a center axis of the mirror surface, and a longitudinal center of the support structure section is substantially placed on the center axis of the mirror surface.

2. A thermally actuated micro mirror according to claim 1, wherein the support structure section includes a first support arm and a second support arm, the electrode section includes a first electrode and a second electrode, the first support arm is disposed between a first end of the mirror surface and the first electrode, the second support arm is disposed between a second end of the mirror surface and the second electrode, and the first end and the second end are symmetric about that the mirror surface.

3. A thermally actuated micro mirror according to claim 1, wherein the support structure section has one support arm, the electrode section has one electrode, and the support arm is disposed between one end of the mirror surface and the electrode.

4. A thermally actuated micro mirror according to claim 2, wherein the first support arm includes a first heater layer, and conductive layers disposed on a first surface and a second surface of the first heater layer to conduct the electricity in order to prevent heat generation in the first heater layer, and the first heater layer generates heat in a portion of the first surface where the conductive layer is not formed so that the first support arm deflects, and
   wherein the second support arm includes a second heater layer, and conductive layers disposed on a third surface and a fourth surface of the second heater layer to conduct the electricity in order to prevent heat generation in the second heater layer, the second heater layer generates heat in a portion of the third surface where the conductive layer is not formed so that the second support arm deflects in the same direction as that of the first support arm.

5. A thermally actuated micro mirror according to claim 3, wherein the support arm includes a heater layer, and conductive layers disposed on one surface and the other surface of the heater layer to conduct the electricity in order to prevent heat generation in the heater layer, and the heater layer generates heat in a portion of the one surface where the conductive layer is not formed so that the support arm deflects.

6. A thermally actuated micro mirror according to claim 1, wherein the support structure section includes a first arm portion that is deflected by the application of the electricity, and a second arm portion disposed parallel to the first arm portion not to be deflected by the application of the electricity thereto, but to be deflected by a change in ambient temperature and by residual internal stress in the same direction as that of the first arm portion in order to compensate for deflection of the first arm portion due to the change in ambient temperature and by the residual internal stress, and
   wherein a longitudinal axis of the first arm portion and a longitudinal axis of the second arm portion are perpendicular to the center axis of the mirror surface, and a longitudinal center of the first arm portion and a longitudinal center of the second arm portion are substantially placed on the center axis of the mirror surface.

7. A thermally actuated micro mirror according to claim 6, wherein one end of the first arm portion is connected to the electrode section, the other end of the first arm portion is connected to one end of the second arm portion, and the other end of the second arm portion is connected to a first end of the mirror surface, and
   wherein the one end of the first arm portion and the other end of the second arm portion are placed on a line parallel to the center axis of the mirror surface.

8. A thermally actuated micro mirror according to claim 7, wherein the support structure section is symmetrically disposed at each of the first end of the mirror surface and a second end of the mirror surface remote from the first end.

9. A thermally actuated micro mirror according to claim 7, wherein the first arm portion includes a first heater layer, a first conductive layer disposed on a first surface of the heater layer to conduct the electricity in order to prevent heat generation in the first heater layer, and a high temperature expansion layer disposed on a second surface of the first heater layer, and the first heater layer generates heat in a portion of the first surface where the first conductive layer is not formed so that the first arm portion deflects, and
   wherein the second arm portion includes a second heater layer, a second conductive layer disposed on a third surface of the second heater layer and on the same side of the first conductive layer in the first arm portion, and a high temperature expansion layer disposed on a fourth surface of the second heater layer, and the second conductive layer conducts the electricity to prevent heat generation in the second heater layer.

10. A thermally actuated micro mirror according to claim 9, further comprising at least one pair of the first and second arm portions, wherein the first arm portions are disposed in the odd-numbered positions from the electrode section, and the second arm portions are disposed in the even-numbered positions from the electrode section.

11. An electronic device having a thermally actuated micro mirror that comprises:
a mirror surface; and
a support structure section having a multilayer structure to support the mirror surface,
wherein the mirror surface is tilted by the deflection of the support structure section caused by a difference in coefficient of thermal expansion in the multilayer structure due to heat generated in the support structure section by the application of electricity,
wherein the support structure section is disposed between the mirror surface and an electrode section for applying the electricity, and
wherein a longitudinal axis of the support structure section is perpendicular to a center axis of the mirror surface, and a longitudinal center of the support structure section is substantially placed on the center axis of the mirror surface.

12. An electronic device according to claim 11, wherein the support structure section includes a first support arm and a second support arm, the electrode section includes a first electrode and a second electrode, the first support arm is disposed between a first end of the mirror surface and the first electrode, the second support arm is disposed between a second end of the mirror surface and the second electrode, and the first end and the second end are symmetric about that the mirror surface.

13. An electronic device according to claim 11, wherein the support structure section has one support arm, the electrode section has one electrode, and the support arm is disposed between one end of the mirror surface and the electrode.

14. An electronic device according to claim 12, wherein the first support arm includes a first heater layer, and conductive layers disposed on a first surface and a second surface of the first heater layer to conduct the electricity in order to prevent heat generation in the first heater layer, and the first heater layer generates heat in a portion of the first surface where the conductive layer is not formed so that the first support arm deflects, and
wherein the second support arm includes a second heater layer, and conductive layers disposed on a third surface and a fourth surface of the second heater layer to conduct the electricity in order to prevent heat generation in the second heater layer, and the second heater layer generates heat in a portion of the third surface where the conductive layer is not formed so that the second support arm deflects in the same direction as that of the first support arm.

15. An electronic device according to claim 13, wherein the support arm includes a heater layer, and conductive layers disposed on one surface and the other surface of the heater layer to conduct the electricity in order to prevent heat generation in the heater layer, and the heater layer generates heat in a portion of the one surface where the conductive layer is not formed so that the support arm deflects.

16. An electronic device according to claim 11, wherein the support structure section includes a first arm portion that is deflected by the application of the electricity, and a second arm portion disposed parallel to the first arm portion not to be deflected by the application of the electricity thereto, but to be deflected by a change in ambient temperature and by residual internal stress in the same direction as that of the first arm portion in order to compensate for deflection of the first arm portion due to the change in ambient temperature and by the residual internal stress, and
wherein a longitudinal axis of the first arm portion and a longitudinal axis of the second arm portion are perpendicular to the center axis of the mirror surface, and a longitudinal center of the first arm portion and a longitudinal center of the second arm portion are substantially placed on the center axis of the mirror surface.

17. An electronic device according to claim 16, wherein one end of the first arm portion is connected to the electrode section, the other end of the first arm portion is connected to one end of the second arm portion, and the other end of the second arm portion is connected to a first end of the mirror surface, and
wherein the one end of the first arm portion and the other end of the second arm portion are placed on a line parallel to the center axis of the mirror surface.

18. An electronic device according to claim 17, wherein the support structure section is symmetrically disposed at each of the first end of the mirror surface and a second end of the mirror surface remote from the first end.

19. An electronic device according to claim 17, wherein the first arm portion includes a first heater layer, a first conductive layer disposed on a first surface of the heater layer to conduct the electricity in order to prevent heat generation in the first heater layer, and a high temperature expansion layer disposed on a second surface of the first heater layer, and the first heater layer generates heat in a portion of the first surface where the first conductive layer is not formed so that the first arm portion deflects, and
wherein the second arm portion includes a second heater layer, a second conductive layer disposed on a third surface of the second heater layer and on the same side of the first conductive layer in the first arm portion, and a high temperature expansion layer disposed on a fourth surface of the second heater layer, and the second conductive layer conducts the electricity to prevent heat generation in the second heater layer.

20. An electronic device according to claim 19, further comprising at least one pair of the first and second arm portions, wherein the first arm portions are disposed in the odd-numbered positions from the electrode section, and the second arm portions are disposed in the even-numbered positions from the electrode section.

* * * * *